US009391423B2

(12) United States Patent
Bulovic et al.

(10) Patent No.: US 9,391,423 B2
(45) Date of Patent: Jul. 12, 2016

(54) METHOD AND APPLICATIONS OF THIN-FILM MEMBRANE TRANSFER

(71) Applicant: MASSACHUSETTS INSTITUTE OF TECHNOLOGY, Cambridge, MA (US)

(72) Inventors: Vladimir Bulovic, Lexington, MA (US); Jeffrey Hastings Lang, Sudbury, MA (US); Apoorva Murarka, Cambridge, MA (US); Annie I-Jen Wang, Cambridge, MA (US); Wendi Chang, Annandale, VA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/541,071

(22) Filed: Nov. 13, 2014

(65) Prior Publication Data

US 2015/0311664 A1    Oct. 29, 2015

Related U.S. Application Data

(63) Continuation-in-part of application No. 13/844,270, filed on Mar. 15, 2013, and a continuation-in-part of application No. 13/604,613, filed on Sep. 5, 2012, and a continuation-in-part of application No. 12/636,757, (Continued)

(51) Int. Cl.
*H01L 29/84* (2006.01)
*G01L 11/02* (2006.01)
(Continued)

(52) U.S. Cl.
CPC ............ *H01S 3/106* (2013.01); *B81C 1/00158* (2013.01); *B81C 1/00634* (2013.01);
(Continued)

(58) Field of Classification Search
CPC ..... G01L 9/0072; G01L 9/0005; G01L 11/02; H01L 29/84
See application file for complete search history.

(56) References Cited

U.S. PATENT DOCUMENTS

| 6,926,670 B2* | 8/2005 | Rich ..................... A61B 5/0031 600/459 |
| 6,963,594 B2* | 11/2005 | Manico .................. H01S 5/022 372/39 |

(Continued)

OTHER PUBLICATIONS

Chang et al., "Electrically tunable organic vertical-cavity surface-emitting laser", Applied Physics Letters, 105, 073303, (2014) Published online Aug. 22, 2014, 4 pages.

(Continued)

*Primary Examiner* — Evan Pert
(74) *Attorney, Agent, or Firm* — Salehi Law Group

(57) ABSTRACT

The disclosure relates to method and apparatus for microcontact printing of micro-electromechanical systems ("MEMS") in a solvent-free environment. The disclosed embodiments enable forming a composite membrane over a parylene layer and transferring the composite structure to a receiving structure to form one or more microcavities covered by the composite membrane. The parylene film may have a thickness in the range of about 100 nm-2 microns; 100 nm-1 micron, 200-300 nm, 300-500 nm, 500 nm to 1 micron and 1-30 microns. Next, one or more secondary layers are formed over the parylene to create a composite membrane. The composite membrane may have a thickness of about 100 nm to 700 nm to several microns. The composite membrane's deflection in response to external forces can be measured to provide a contact-less detector. Conversely, the composite membrane may be actuated using an external bias to cause deflection commensurate with the applied bias. Applications of the disclosed embodiments include tunable lasers, microphones, microspeakers, remotely-activated contact-less pressure sensors and the like.

36 Claims, 19 Drawing Sheets

Related U.S. Application Data filed on Dec. 13, 2009, now Pat. No. 8,739,390, and a continuation-in-part of application No. 12/903,149, filed on Oct. 12, 2010, now Pat. No. 8,963,262.

(60) Provisional application No. 61/903,507, filed on Nov. 13, 2013, provisional application No. 61/696,041, filed on Aug. 31, 2012, provisional application No. 61/528,148, filed on Aug. 27, 2011, provisional application No. 61/138,014, filed on Dec. 16, 2008, provisional application No. 61/251,255, filed on Oct. 13, 2009.

(51) Int. Cl.

| | | |
|---|---|---|
| *H01S 3/106* | (2006.01) | |
| *H01S 3/0933* | (2006.01) | |
| *H01S 3/0941* | (2006.01) | |
| *H01S 3/07* | (2006.01) | |
| *H01S 3/08* | (2006.01) | |
| *H01S 3/16* | (2006.01) | |
| *H01S 3/13* | (2006.01) | |
| *H01S 3/105* | (2006.01) | |
| *G02B 26/00* | (2006.01) | |
| *G01L 9/00* | (2006.01) | |
| *B81C 1/00* | (2006.01) | |

(52) U.S. Cl.
CPC ............. *G01L9/0005* (2013.01); *G01L 9/0072* (2013.01); *G01L 11/02* (2013.01); *G02B 26/001* (2013.01); *H01L 29/84* (2013.01); *H01S 3/07* (2013.01); *H01S 3/08059* (2013.01); *H01S 3/0933* (2013.01); *H01S 3/0941* (2013.01); *H01S 3/1053* (2013.01); *H01S 3/1305* (2013.01); *H01S 3/16* (2013.01); *H01S 3/1693* (2013.01); *B81B 2201/02* (2013.01); *B81C 2201/0194* (2013.01)

(56) References Cited

U.S. PATENT DOCUMENTS

| | | | | |
|---|---|---|---|---|
| 7,315,161 B2 * | 1/2008 | Zribi | ................. | G01R 33/0283 324/117 R |
| 7,901,970 B2 * | 3/2011 | Zribi | ................. | G01R 33/0283 438/48 |
| 8,686,519 B2 * | 4/2014 | Langereis | ........... | G01P 15/0802 257/347 |

OTHER PUBLICATIONS

Bulovic et al., "Method for thin-film membrane transfer", Nov. 12, 2013, 9 pages.

Wang et al., "Transfer-Printed Composite Membranes for Electrically-Tunable Organic Optical Microcavities" MEMS 2014, San Francisco, CA, USA, Jan. 26-30, 2014, pp. 1217-1.

\* cited by examiner

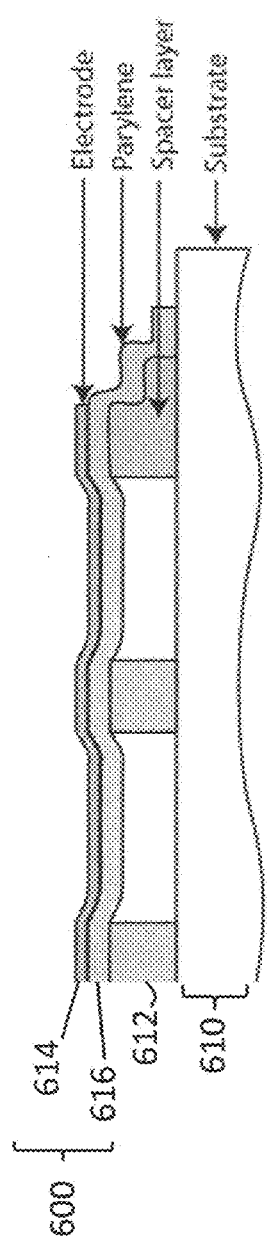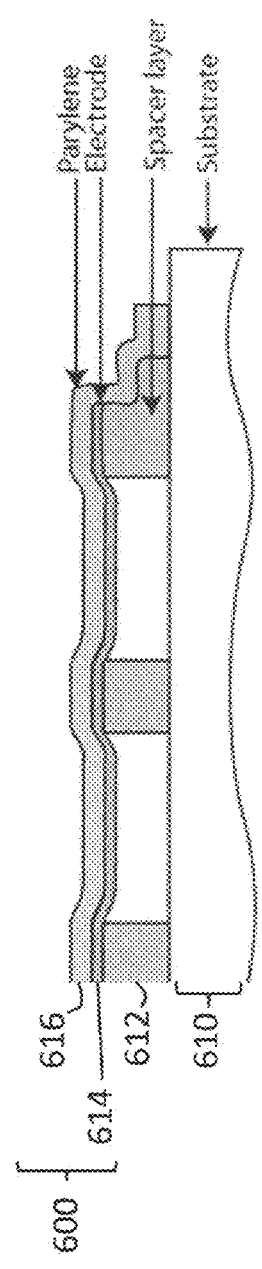

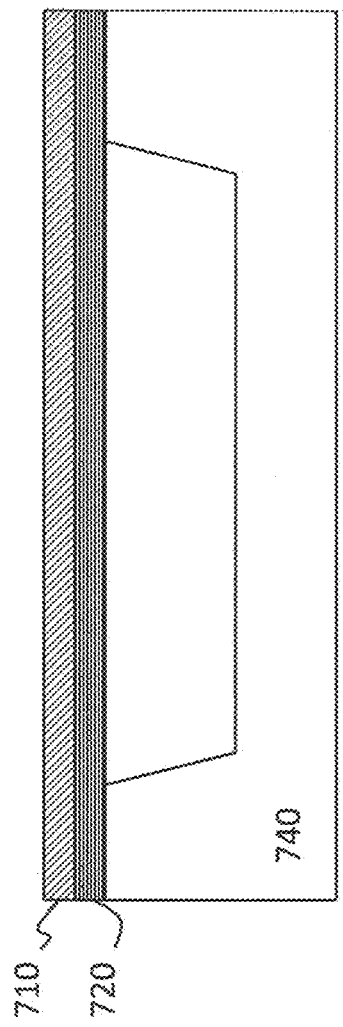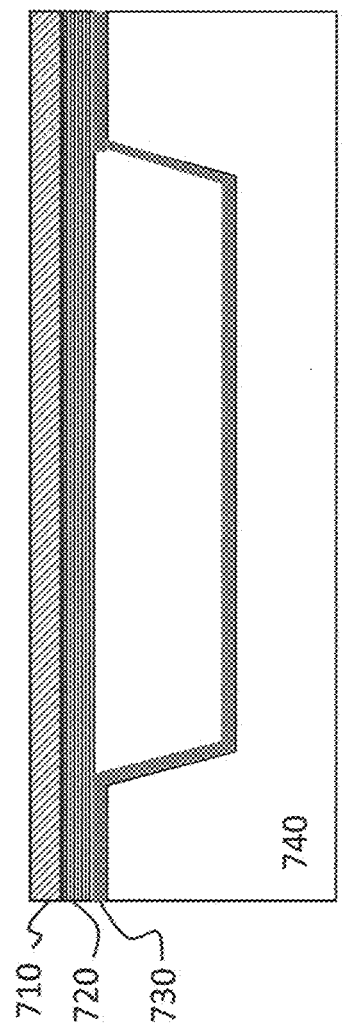

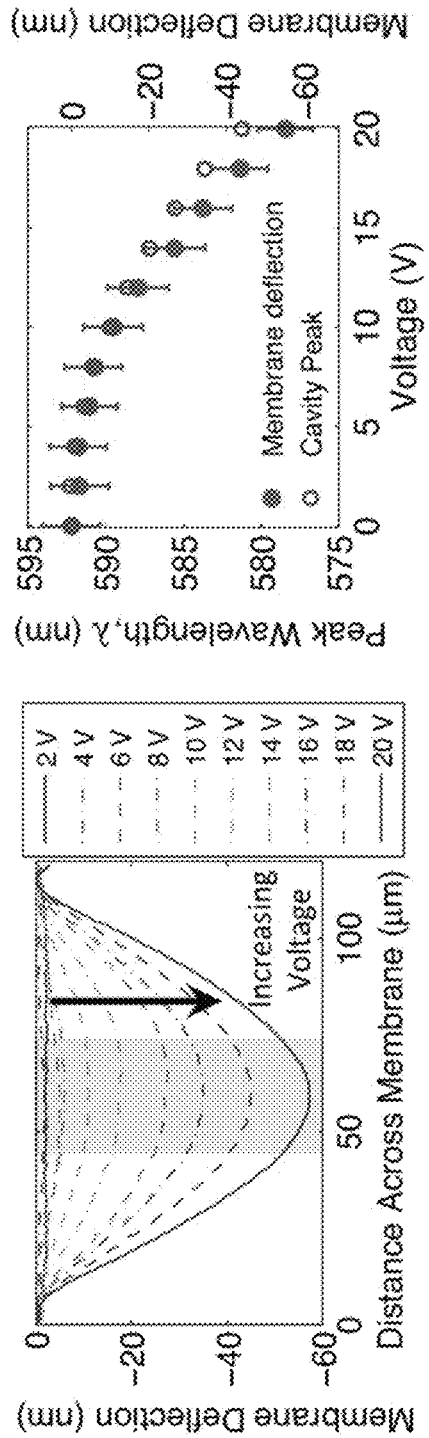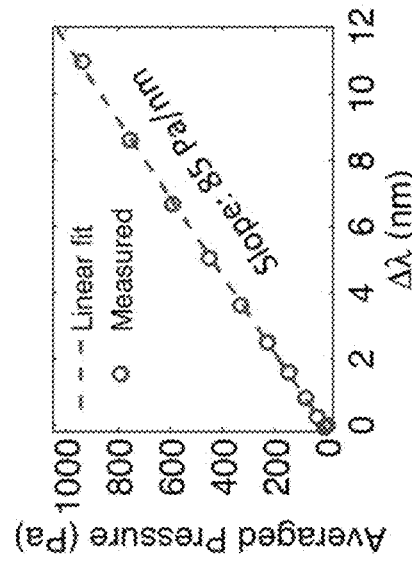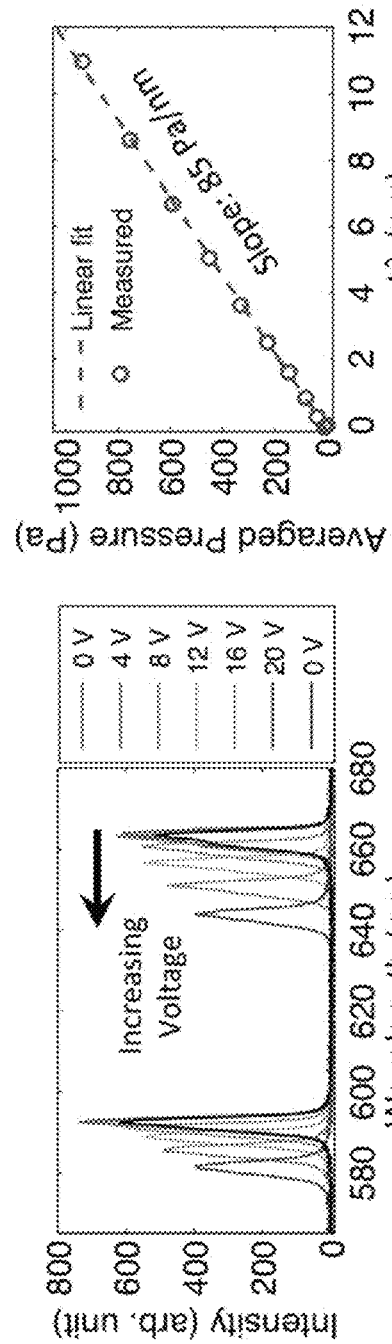
Fig. 9A Fig. 9B Fig. 9C Fig. 9D

METHOD AND APPLICATIONS OF THIN-FILM MEMBRANE TRANSFER

The application claims the filing-date priority of Provisional Application No. 61/903,507 (filed Nov. 13, 2013) and is a continuation-in-part (CIP) of application Ser. No. 13/844,270, filed Mar. 15, 2013, which claimed priority to Provisional Application Ser. No. 61/696,041, filed Aug. 31, 2012; the instant application is also a continuation-in-part (CIP) of application Ser. No. 13/604,613, filed Sep. 5, 2012 (which claims priority to Provisional Application No. 61/528,148, filed Aug. 27, 2011); and application Ser. No. 12/636,757 (now U.S. Pat. No. 8,739,390), filed Dec. 13, 2009 (which claims priority to Provisional Application Ser. No. 61/138,014, filed Dec. 16, 2008); the instant application is also a continuation-in-part (CIP) of application Ser. No. 12/903,149, filed Oct. 12, 2010 (which claims priority to Provisional Application No. 61/251,255, filed Oct. 13, 2009). The disclosure of each of these applications are incorporated herein in its entirety.

BACKGROUND

1. Field

The disclosure relates to method and apparatus for transfer printing (or additive fabrication) of micro-electromechanical systems ("MEMS"). More specifically, the disclosure relates to novel applications and methods for solvent-free transfer printing of MEMS structures.

2. Description of Related Art

MEMS applied over large areas enable applications in such diverse areas as sensor skins for humans and vehicles, phased array detectors and adaptive-texture surfaces. MEMS can be incorporated into large area electronics. Conventional photolithography-based methods for fabricating MEMS have provided methods and tools for producing small features with extreme precision in processes that can be integrated with measurement and control circuits. However, the conventional methods are limited to working within the existing silicon semiconductor-based framework. Therefore, there is a need for improved processes that enable construction of novel MEMS devices heretofore unattainable.

SUMMARY

The disclosed embodiments are directed to forming MEMS structures via solvent-free methods. In one embodiment, the MEMS structure is formed by depositing a parylene layer over a supporting structure. The supporting structure may comprise any one of a silicon, silicon dioxide or quartz-growth, or plastic or metal foil substrate. The supporting structure may be rigid or semi-rigid. The parylene may be formed directly over the supporting structure using, for example, chemical vapor deposition (CVD). The parylene film may have a thickness in the range of about 100 nm-2 microns; 100 nm-1 micron, 200-300 nm, 300-500 nm, 500 nm to 1 micron and 1-30 microns. Next, one or more secondary layers are formed over the parylene to create a composite membrane. The secondary layers may comprise conductive, semi-conductive or non-conductive material. The secondary layers may comprise organic or inorganic material. The composite membrane may have a thickness of about 100 nm to 700 nm to several microns. In an exemplary embodiment, the composite membrane of about 250 nm may include a 200 nm parylene layer and a 50 nm gold layer.

The composite membrane may be then delaminated from the supporting structure and transferred onto a receiving substrate. The receiving substrate may include one or more ridges defining at least one cavity. The composite membrane may be aligned and positioned over the cavity to at least partially cover the cavity. In an exemplary embodiment, the cavity is entirely covered by the composite membrane.

In one embodiment, the disclosure relates to a solvent-free additive membrane transfer technique in an electrostatically tunable organic device where electrical actuation and optical characterization of a completed device show spectral tuning greater than 20 nm for membrane deflections of over 200 nm at 50 V. Shorter optical cavities with fewer modes, fabricated using a solvent-free additive membrane transfer technique result in higher tunable range at a lower applied voltage. The disclosed device structure may be applied to pressure/acoustic sensing, sound production, and tunable optical device applications (including organic lasing applications). The composite membrane elements may be varied in both geometry and composition to optimize device performance and to explore other physical phenomenon.

BRIEF DESCRIPTION OF THE DRAWINGS

These and other embodiments of the disclosure will be discussed with reference to the following exemplary and non-limiting illustrations, in which like elements are numbered similarly, and where:

FIGS. 6A and 6B illustrate exemplary capacitive transducers according to various embodiments of the disclosure;

FIGS. 7A and 7B schematically show zipper actuators according to embodiments of the disclosure;

FIGS. 9A-9D show the measured device cavity mode characteristics under applied bias for the exemplary device of FIG. 8A;

DETAILED DESCRIPTION

Figure 1:
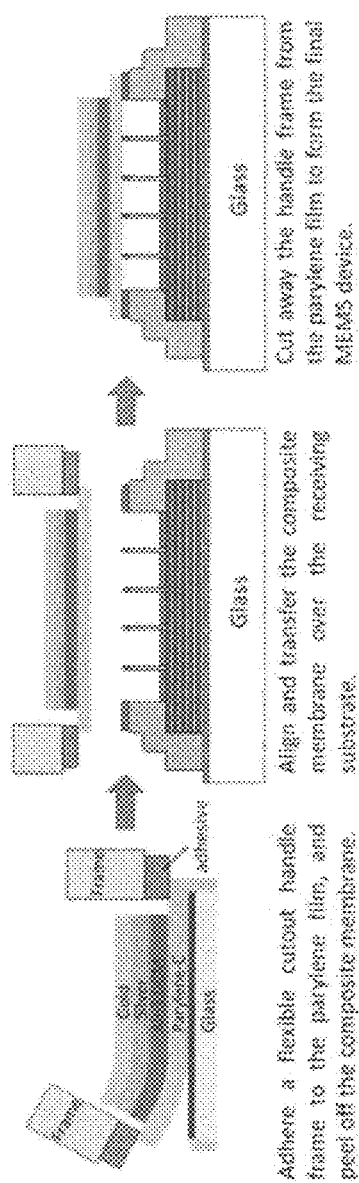
FIG. 1 is a schematic representation of a process according to one embodiment of the disclosure.

The disclosed embodiments are generally directed to a solvent-free, room-temperature method for transferring very thin unsupported functional films along with several novel MEMS and optoelectronic devices that can be fabricated using such suspended micron- and submicron-thick composite membranes. In one application, poly-para-xylylenes (Parylenes) are used as very thin unsupported functional films.

In one embodiment, the disclosure relates to a solvent-free room-temperature method for transferring very thin unsupported functional films along with novel MEMS and optoelectronic devices fabricated using the disclosed suspended micron- and submicron-thick composite membranes. The solvent-free release and transfer technique for thin membranes may be enabled by using a micron- or sub-micron-thick vapor-deposited polymer, parylene. The chemically robust parylene film can be compatible with both vapor- and solution-based deposition methods useful for the fabrication of composite membranes having an arbitrary number of patterned layers of active materials. The active layers can be formed of metal, oxide, nanoparticle, polymer, or small molecule organic thin films, with each layer a few Angstroms to hundreds of nanometers thick. Despite their ultrathin nature, the large area ($mm^2$-$dm^2$) parylene-based multi-layer membranes maintain their structural integrity when fully released from the carrier substrate on which they are fabricated. The membranes can then be transferred to a pre-patterned substrate to form suspended-membrane cavity device structures.

These innovative techniques may be applied to fabricate a variety of device structures for both MEMS, optoelectronics and other applications, including: optical MEMS such as tunable MEMS organic vertical-cavity surface-emitting lasers (VCSEL), contactless readout optical pressure sensors and capacitive MEMS including speakers, microspeakers, microphones, capacitive pressure sensors.

Parylenes conventionally defines a class of conformal, pinhole-free transparent polymers formed by vapor deposition polymerization. Parylene has been used as both moisture and dielectric barriers. Several types of parylene are commercially available, differing in their ring-substituted species and corresponding dielectric, mechanical and chemical properties. One of the most common parylene polymers, parylene C, substitutes a chlorine atom for one of the aromatic hydrogen atoms. Compared to the unsubstituted parylene N, parylene C deposits as a denser film with higher breakdown voltages for films thinner than five (5) microns. Parylene C's excellent solvent resistance and barrier properties have been exploited for industrial use to encapsulate circuit boards, biomedical devices and for other barrier coatings. In the moderate vacuum deposition process, the substrate remains at room temperature and is not subjected to solvents, reactive reagents or catalysts which are often required for deposition of other polymers.

Parylenes offers a wide range of desirable chemical, mechanical, electrical and optical properties. Parylene C in particular combines a relatively high melting point of 290° C. with mechanical strength and chemical resistance. The room temperature vapor deposition process forms smooth, conformal, homogeneous low dielectric constant (k) films with low residual stress and high flexibility and heat moldability.

Parylene has been shown to form continuous, pinhole-free layers at thicknesses as low as 30 nm. Its flexibility and mechanical robustness at very thin layer thicknesses enables the solvent-free release of free-standing membranes. In our laboratory we have demonstrated that large-area (up to 100 mm diameter) free-standing parylene films as thin as 250 nm-thick can be peeled off of silicon or glass wafers as a continuous sheet.

The relatively chemically inert and insoluble parylene surface is amenable to thin film deposition by both vapor- and solution-based methods, such as thermal evaporation, sputtering, and spin-casting. Because parylene films are formed via an inline vacuum deposition process, the parylene surface can be kept pristine and free of contaminants such as dust particles, oxygen, or water which can negatively impact the performance of subsequently-deposited active layers. In fact, parylene itself can be used as an encapsulant for sensitive materials.

Suspended-membrane MEMS microstructures are typically fabricated by silicon micromachining techniques that often involve harsh chemical and/or plasma etches, wafer bonding and elevated temperature processing. As an alternative, microcontact printing process demonstrates additive fabrication of thin suspended metal films using an elastomeric transfer pad. One such process was disclosed in patent application Ser. No. 12/903,149 filed by Applicant on Oct. 12, 2010 (the disclosure of which is incorporated herein in its entirety).

This contact printing process avoids using solvents, etchants and elevated temperatures. However, it relies on significant adhesive forces on the receiving substrate surface (e.g., Polydimethylsiloxane (PDMS)) to successfully transfer films off the transfer pad, limiting the choice of substrate materials. The introduction of a solvent-assisted release step relaxes the surface adhesive force requirements and enables the use of a wider range of substrates (e.g. PDMS, Si, $SiO_2$) by lowering the stamping and lift-off pressures required. One such process was disclosed in patent application Ser. No. 13/604,613 filed by Applicant on Sep. 5, 2012 (the disclosure of which is incorporated herein in its entirety).

While the solvent-assisted contact printing process could be utilized to fabricate and transfer a multi-layer composite membrane, the composite is limited to solvent-insensitive materials. This requirement precludes the use of most organic semiconductors, which are of interest for optoelectronic applications including lasers and photovoltaics power sources.

In contrast, the parylene-based membrane transfer method presented in accordance with the instant disclosure provides an additive process that allows the integration of both solvent- and temperature-sensitive materials into multi-layer composite membranes. The separation of membrane fabrication from patterning of the receiving substrate protects sensitive materials in the membrane (e.g., organic semiconductors) from harsh processing conditions without limiting the allowable fabrication processes used to fabricate other parts of the complete device.

Exemplary methods are disclosed herein for membrane fabrication, release and solvent-free transfer in accordance with various embodiments of the disclosure. It should be noted that the disclosed embodiments, including ranges and other provided dimensions are exemplary and non-exclusive.

In one exemplary implementation, a rigid or semi-rigid carrier or supporting substrate (e.g., glass or polyimide) was cleaned and treated with a release agent (such as a 1% solution of Micro-90 detergent) to allow easier release of the completed membrane after fabrication. A base layer of parylene (e.g., 200 nm-1 micron thick) was deposited by chemical vapor deposition (CVD) onto the supporting substrate.

It should be noted that although other parylene variants may be employed, for demonstrated devices a singly-chlorinated version of parylene (e.g., poly-chloro-p-xylylene or parylene-C) was used, and references to "parylene" hereafter refer to parylene-C. Metal, oxide, nanoparticle, polymer, and/or organic layers may then be sequentially deposited and patterned on top of the parylene. The exact stack composition and layout (materials, layer thicknesses, geometries) may be determined as a function of the specific application. A flexible cutout handle frame was attached to the completed multi-layer membrane (around all edges for even tensioning) and the membrane was delaminated from the carrier. The continuous sheet may then be transferred to a pre-patterned substrate (i.e., receiving substrate) with or without inverting the membrane. The handle was then removed to leave behind the unsupported membrane. The handle removal can be implemented by methods such as cutting or dry etching.

In one embodiment, lateral patterning of each active layer deposited on the parylene membrane allows the fabrication of multiple multi-layer stacks with disparate functionalities in different areas on the same membrane. Fabrication of multiple arrays of suspended-membrane cavities can be completed in a single transfer. A single membrane can cover the entire receiving substrate. The area transferred (i.e., the membrane surface area) is limited only by the mechanical robustness of the membrane. In one application a membrane area larger than 70 $cm^2$ was produced using the disclosed principles. Beyond the relatively smooth planar carrier substrates used to fabricate the demonstrated devices, a micro-textured or nano-patterned carrier might enable the fabrication of 3D structured membranes for transfer. Such a carrier template could be designed to confer specific stress-relieving properties or optical effects in the membrane. According to one embodiment of the disclosure, the conformal nature of parylene deposition enables a uniform coating thickness even at very thin layers.

In some specific embodiments it may not be desirable to keep parylene as part of the completed membrane stack. Although insoluble in most organic solvents and resistant to acid and base attack, parylene may be dry etched in an oxygen plasma thereby allowing removal of the exposed parylene base layer of an inverted transferred membrane. Several examples of novel MEMS technologies fabricated using the solvent-free membrane transfer method are presented below for non-limiting illustrative purposes.

Tunable Lasers—

Compact, single system dynamically tunable lasers are desirable for a number of applications ranging from basic scientific research to commercial uses such as telecommunications, displays or medical imaging systems. Currently, tunable MEMS VCSELs using inorganic lasing semiconductors have gained popularity. Operating at infrared (IR) wavelengths, such devices have been commercialized for biomedical optical coherence tomography (OCT) systems. However, comparable compact visible wavelength lasers are not commercially available. Conventionally reported frequency-tunable laser devices in the visible spectrum have employed unwieldy external micro-actuated mirror stages in external cavity systems, switchable gain media, very high operating voltages, or fabrication of multiple lasers, each with a predetermined output spectrum. These conventional systems are often bulky and inconvenient to employ in device applications or involve costly non-scalable fabrication techniques such as electron beam lithography. Thus, there is a technological need for compact tunable lasing devices in the visible wavelengths.

Organic-based lasing materials offer broad tunability in the visible spectrum, and a variety of polymer and small molecule organic systems have been utilized for solid state lasers. For example, organic gain medium lasers have been disclosed in a microcavity VCSEL geometry to provide tunable organic VCSEL devices that utilize MEMS structures to change the optical cavity length. This approach relies on etching out a sacrificial layer to form the variable air-gap, unlike the disclosed additive membrane fabrication process. Etching a sacrificial layer to form a variable air-gap has been demonstrated for inorganic lasing systems that emit in the infrared but not for organic lasing materials which would degrade due to exposure to the typical etchants and solvents.

Figure 2:
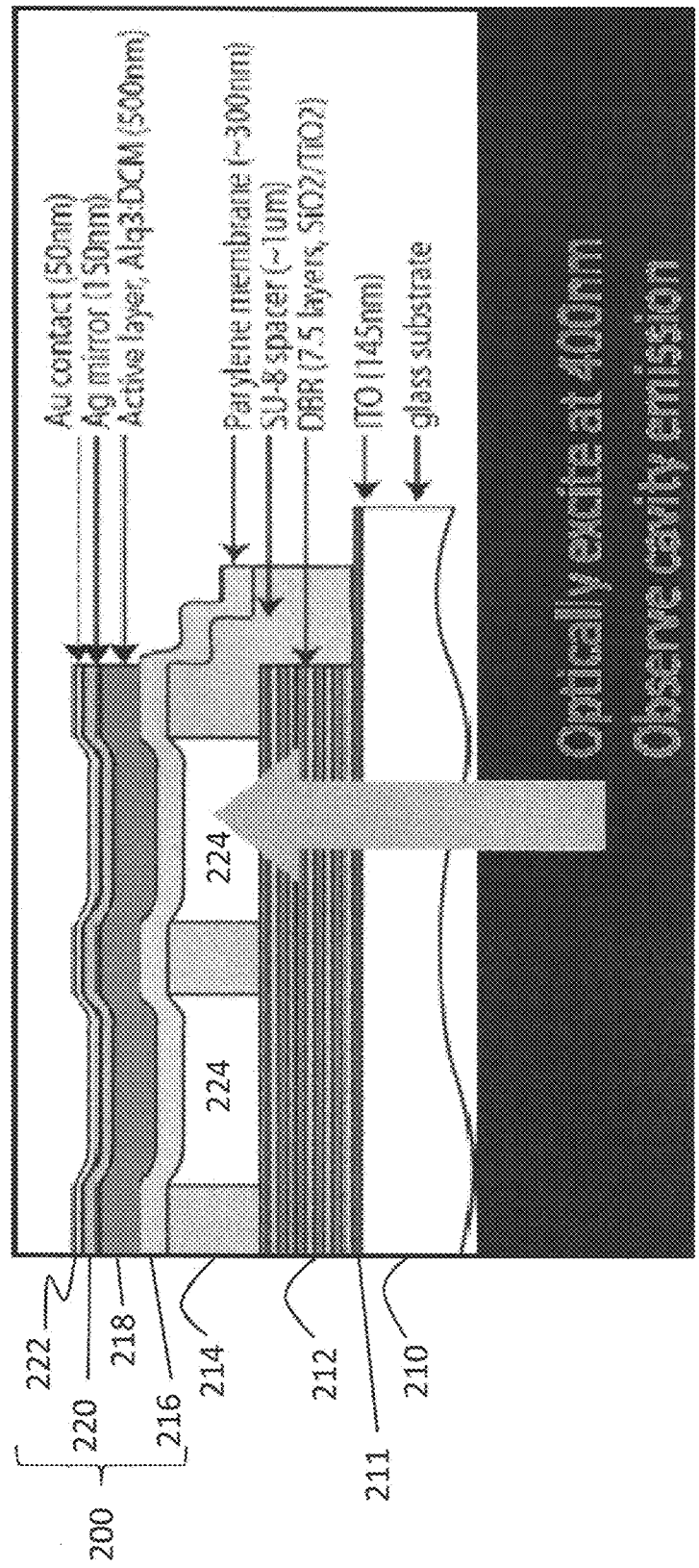
FIG. 2 schematically shows the cross-sectional area of a device according to one embodiment of the disclosure.

FIG. 2 schematically shows the cross-sectional area of a device according to one embodiment of the disclosure. Specifically, FIG. 2 illustrates an exemplary device architecture for lasing and pressure sensing applications. The device architecture may use the transfer printed flexible composite membrane disclosed herein. In FIG. 2, the composite membrane 220 comprises an organic gain medium 218, as well as silver mirror 220, which forms a resonator cavity with the distributed Bragg reflector (DBR) 212 deposited on substrate 210 prior to the membrane transfer. The membrane transfer may be implemented in accordance to the disclosed embodiments.

In FIG. 2, spacer layer 214 is photolithographically patterned in an epoxide-based photoresist, Micro-Chem® SU-8, but other materials including but not limited to silicon dioxide ($SiO_2$) or silicon nitride (SiN) may also be used. Applying a voltage bias between the ITO bottom electrode 211 and metallic membrane 222 or the silver mirror 220 electrostatically actuates composite membrane 200 to dynamically tune the device optical spectra by decreasing the height of cavity 224. Interferometric imaging confirms that the top mirror is mechanically deflected with applied bias.

In FIG. 2, active layer 218 provides optical emission with wavelengths within the acceptable reflective range of mirror 212 and mirror 220. In the exemplary structure, active layer 218 provides luminescence to form cavity modes or optical gain to form lasing mode. An external optical pump optimized for active layer absorption can be used to excite the layer. Active layer material includes but not limited to organic dyes, emissive polymer or nanoparticles.

Figure 3:
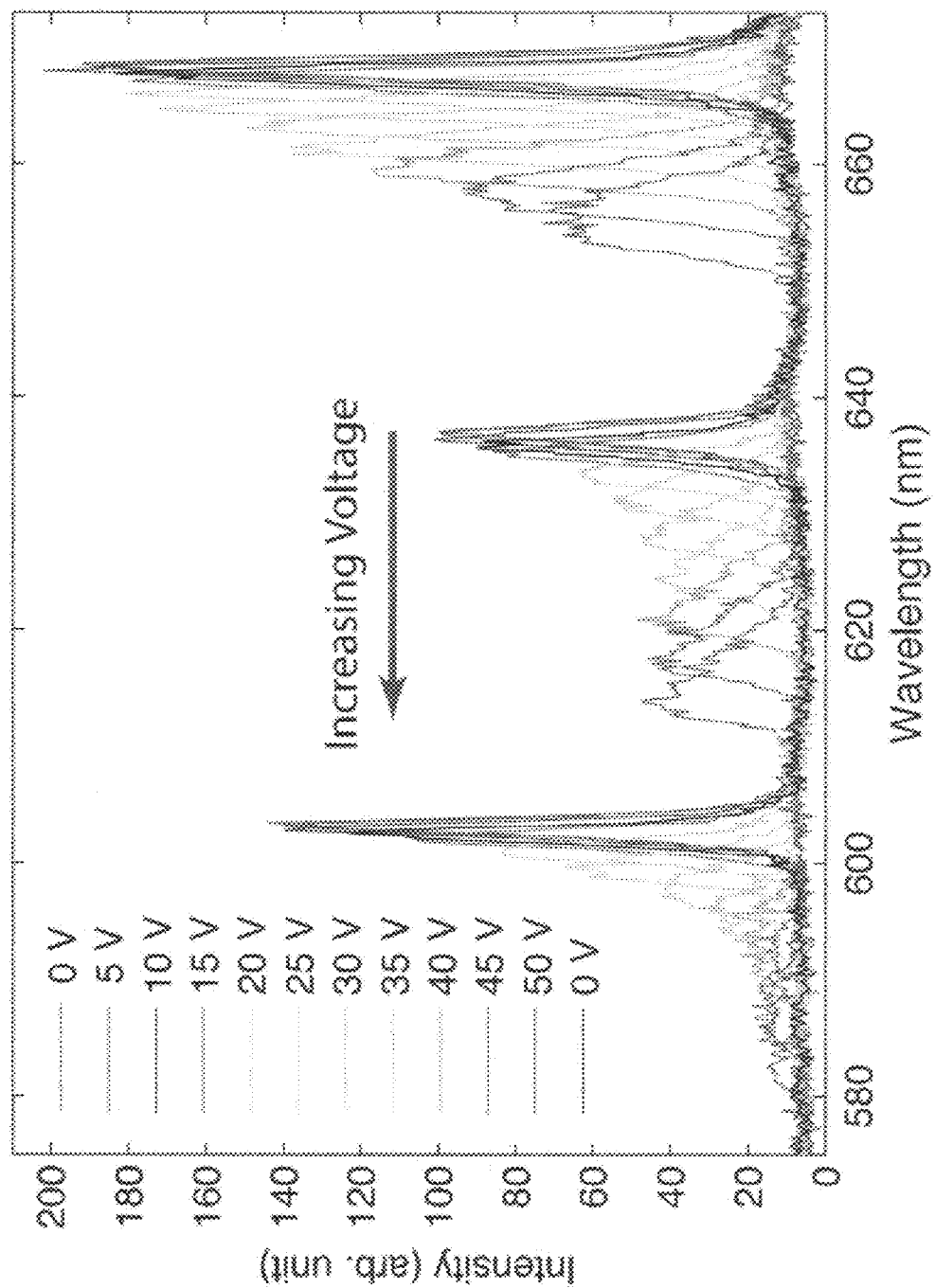
FIG. 3 shows the optical cavity mode spectra shift for a device according to one embodiment of the disclosure.

In an experiment where bias was applied to the electrodes 211 and 222, the emission spectra shifted as a function of the applied bias. FIG. 3 shows the optical cavity mode spectra shift for a device optically pumped below the lasing threshold. For the device tested in FIG. 3, the tunable range of electrostatic pressure is over 23 nm. In FIG. 3, the fitted peak of the 637 nm cavity mode indicates a reversible tunable range up to 23 nm. For the device of FIG. 3, the estimated equivalent electrostatic pressure ranges up to 6 kPa, suggests the applicability of the device for all-optical remote pressure sensing.

Figure 4:
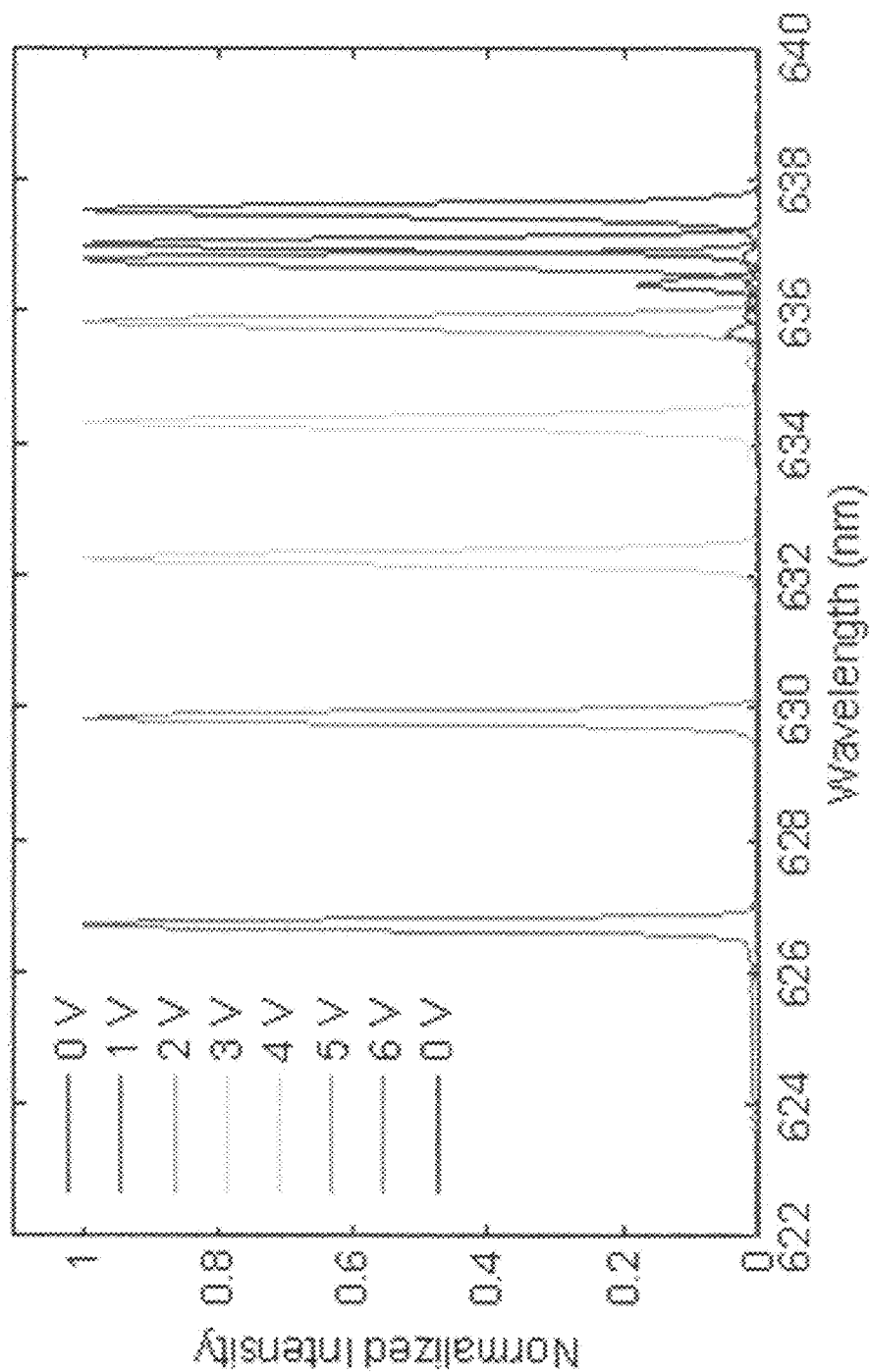
FIG. 4 shows a plot of the lasing mode intensity shift versus wavelength from a device manufactured according to a disclosed embodiment.

FIG. 4 shows a plot of normalized intensity versus wavelength from a device manufactured according to a disclosed embodiment. Specifically, FIG. 4 plots the measured emission spectra of a similar device (fabricated with more optimized device dimensions), which exhibited over 10 nm laser mode tuning for applied voltages up to 6 V. To further decrease the operating voltage, the structure can be optimized beyond the fabricated devices, for example, by placing the bottom electrode over (instead of under) the DBR mirror or by replacing DBR 212 and ITO 211 with a thin reflective film of silver (not shown) to serve as both the bottom mirror and the electrode.

Contactless Readout Optical Pressure Sensors—

To form the tunable cavity or laser in the previous exemplary device, an electrostatic pressure is deliberately applied to the membrane-cavity structure to shift the emitted laser wavelength. In another embodiment—the cavity mode or lasing mode shifts are observed in response to ambient pressure, thereby using the device as a mechanical pressure sensor with optical readout. Because the device is intrinsically a contactless readout system that can be remotely interrogated, an all-optical (optically driven and optically sensed) pressure sensor may be used in environments that do not allow electrical wiring or external connections.

Conventional all-optical photonic crystal-based pressure sensors have been reported using patterned array of nanopillars. However, the conventional sensing process requires additional two-dimensional imaging and analysis of interference patterns. The disclosed embodiment in utilizing composite membranes for tunable cavity or lasing is the first step in realizing a pneumatic pressure sensor. The disclosed embodiment relaxes the image processing system requirements due to the high lasing output intensity and single point wavelength detection.

Figure 5:
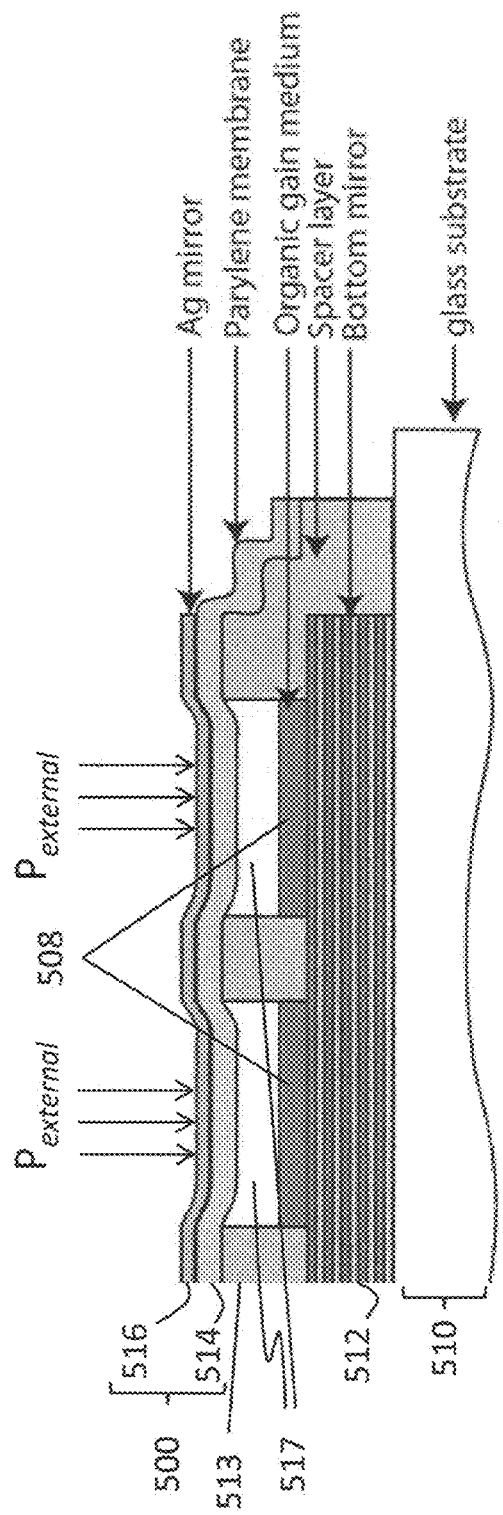
FIG. 5 schematically shows an optical contactless pressure sensor according to one embodiment of the disclosure.

FIG. 5 schematically shows an optical contactless pressure sensor according to one embodiment of the disclosure. Here, the organic gain medium is deposited inside the micro-cavity instead of the suspended s membrane. The device of FIG. 5 includes glass substrate 510, bottom mirror 512, spacer layer 513, organic gain medium (active layer) 508, parylene membrane 514 and silver (Ag) mirror 516. For the lasing device shown in FIG. 5, the equivalent pressure on the membrane at 6V applied bias is calculated to be about 60 Pa. This suggests a pressure sensitivity of approximately 1 nm wavelength shift per 6 Pa applied pressure. The device sensitivity may be increased to match application specifications by optimizing the device structure, e.g., by increasing the area of the suspended membrane 500 or by decreasing the flexure rigidity of membrane 500.

In one implementation, light of known wavelength/s may be directed at substrate 510. The substrate may be transparent to the excitation source wavelength. The light rays may be provided by an external light source, such as a light emitting diode (LED) device or a pump laser. The light rays will optically excite the organic gain medium 508 inside each cavity 517 to produce optical rays with wavelengths determined by the optical cavity, known as cavity modes. The external light source intensity may be increased to create lasing action in cavity to produce lasing mode. An external pressure will cause membrane 500 to deflect inward as shown in FIG. 5. The deflection will change the height in the cavity, thereby changing the wavelengths of light inside cavities. The change in wavelengths of the light inside each cavity 517 will cause a change in color of the cavity modes or lasing mode. Wavelength filtered detectors (such as a spectrometer, single wavelength detection systems or interferometer) can be used to detect changes in color and thereby correlate the color change to the external pressure. The device of FIG. 5 does not require biasing the device to readout the exerted pressure. But the device could be biased, if needed, using an external power source. For example, an additional electrical bias can be applied to further linearize the response. The external pressure could then further deflect the membrane.

Decreasing rigidity of membrane 500 may be accomplished by lowering the total membrane thickness (e.g., by reducing the metal mirror thickness) or by choosing material of lower Young's modulus. It is also possible to thin membrane 500 by moving the organic gain medium either partially or completely out of the composite membrane and into other regions of the microcavity. FIG. 5 shows an example of a device structure with the organic gain medium (active layer) deposited in the cavities on the patterned bottom substrate instead of embedded in the suspended membrane.

It should be noted that although the disclosed device employs vapor-deposited small-molecule organic semiconductors as the organic gain medium, other materials and deposition methods may be used to incorporate the gain medium into the device structure without departing from the disclosed principles. For example, it may be possible to fill the cavity with an inkjet-printed polymer or quantum dot gain or colloidal quantum dots material prior to depositing the suspended membrane.

Capacitive MEMS Transducer Applications—

In one disclosed embodiment, the parylene-assisted transfer method is used to fabricate a wide variety of capacitive MEMS sensors and actuators such as pressure sensors, microphones, microspeakers, hearing aids, ultrasound transducers, and large-area arrays of these sensors and actuators.

A capacitive transducer may include an electrically-conductive deflectable diaphragm or membrane that is suspended over a counter electrical electrode. The membrane can be a composite membrane, comprising one or more metals, polymers, organic films and combinations thereof. The distance between the membrane and the counter-electrode determines the capacitance of the structure. A capacitive transducer can be electrically described as a variable capacitor since its capacitance changes with the instantaneous distance between the membrane and the counter electrode.

FIGS. 6A and 6B illustrate exemplary capacitive transducers according to various embodiments of the disclosure. Each of the embodiments of FIGS. 6A and 6B includes substrate 610, spacer layer 612, parylene layer 616 and top electrode 614. FIGS. 6A and 6B provide a schematic cross-section of suspended membrane structure with parylene-based membrane additively transferred on top of spacer layer without inverting (FIG. 6A) or inverted (FIG. 6B). In one embodiment, the substrate itself may serve as counter electrode or may include arbitrarily patterned electrodes or other active layers for enhanced functionality.

Such a structure can be used to sense any physical phenomenon that causes the distance between the membrane and the counter electrode to change, such as pneumatic/mechanical pressure fluctuations and sound waves. Additionally, a time-varying electrical signal may be applied between suspended membrane 600 and the counter electrode to continuously displace membrane 600 with respect to the counter electrode. The membrane displacement, in turn, results in the displacement of air next to the membrane, generating sound.

In one embodiment, the counter electrode(s) are deposited, implanted or patterned on substrate 610. Substrate 610 may serve as a counter electrode if it is a conductor or a semiconductor or a highly-doped semiconductor. Additionally, a thin conducting film such as indium tin oxide (ITO) may be deposited and patterned to form counter electrodes on the substrate if substrate 610 is an insulator, as in the case of glass and polymeric substrates. Furthermore, control electronics—such as drive and sense circuitry for each cavity transducer, drive and sense electrodes for each cavity transducer, and transducer-array control electronics (for phasing and/or beam-forming) for simultaneous actuation or operation of multiple transducers—may be implemented in the substrate prior to the MEMS fabrication process (including membrane transfer). For example, the drive electrodes at the bottom of each cavity may be patterned to effect an asymmetrical deflection of the membrane in each cavity, enabling the implementation of deflectable mirrors with tunable normals for digital micromirror devices utilized in digital light processing technologies. Such control electronics may also be implemented using an application-specific integrated circuit (ASIC) not localized on the MEMS device substrate.

FIGS. 7A and 7B schematically show zipper actuators according to embodiments of the disclosure. Specifically, FIGS. 7A and 7B show schematic cross-section of a suspended membrane structure implementing a capacitive zipper actuator. Each of FIGS. 7A and 7B show substrate 740 supporting a membrane that comprises insulator 720 and conducting membrane 710. Insulator 720 may comprise parylene. FIG. 7B shows second insulator 730. The substrate serves as counter electrode if it is conducting or semiconducting. Otherwise, an additional conducting film may be deposited on the substrate to form a counter electrode to the suspended membrane. Insulator 730 can be the same as Insulator 720, depending on the transducer functionality.

The capacitive zipper actuator of FIGS. 7A and 7B may also be fabricated using the aforementioned transfer-printing technique. In such actuators, the cavities in the underlying substrate have sloping sidewalls, allowing the applied electrical field to be concentrated near the top of the cavity. This enables the application of smaller voltages to achieve membrane deflections. Such an actuator could potentially produce larger recoverable deflections of the suspended membrane, for applications in acoustics and optics.

Furthermore, a single composite membrane can be used to enclose cavities of varying geometries (sizes, diameters, depths, and shapes) to implement a range of different functions and specifications on a single device. This can enable different membrane deflection depths and deflection profiles to be achieved in different areas of the same membrane.

Moreover, the composite membrane may also enclose chemicals/reactants within the membrane itself, and also in the underlying cavities, hence forming electrically-actuated chemical reaction cells. The membrane may release the encapsulated chemicals into the underlying cavities upon electrically-assisted mechanical rupture of the membrane. This can be achieved by simply applying a voltage or current signal between the membrane and the counter electrode at the bottom of the underlying cavities.

Conventionally, capacitive MEMS devices have been fabricated using integrated-circuit (IC) fabrication technologies. The high aspect-ratio features often necessary in these devices are usually fabricated using deep reactive-ion etching (DRIE), which is a costly, solvent-heavy and time-consuming. Conductive membranes that can deflect have to be deposited via high temperature and pressure processes, and then under-etched. These processing steps add to the overall processing-time and cost of the final device. The disclosed embodiments obviate DRIE deficiencies and enable the simple additive fabrication of conductive membranes for MEMS devices at room temperature via transfer-printing.

The disclosed transfer-printing process allows the fabrication of multiple devices in a small spatial footprint. Multiple sensors/actuators or high sensor/actuator density is necessary for various applications such as high quality earphone sound, spatially-resolved pressure sensing for structural integrity and wind tunnel testing, and phased array acoustic imaging. These applications can be addressed using the disclosed fabrication technology. Additionally, since the MEMS sensors and actuators fabricated using the aforementioned processes are capacitive in design, their power consumption is lower due to low current consumption. This aids in prolonging the battery life of devices in which these sensors and actuators are used. Furthermore, the disclosed technologies may be used for fabricating texture-adaptive surfaces (in which micro-scale deflections can be actuated across an array) that hold promise for such applications as reflective displays, cryptography, and adaptive optics.

Electrically Tunable VCSEL and Contactless Pressure Sensors—

As briefly discussed, the development of compact, tunable laser arrays benefits many applications including remote sensing, spectroscopy, optical switching, and large-area sensory skins. For applications that require large-area sensing, in particular, it is desirable to develop lasing structures that could be scalably deployed, and that operate in the visible or near-infrared range, which can be easily imaged. In this spectral range, molecular and polymeric organic thin films have already been demonstrated as broadly tunable lasing gain media, with some reports demonstrating lasing over a >100 nm wavelength range using a single organic guest-host material system. Also, due to the development of commercialized organic light emitting diode (OLED) technologies, multiple techniques have been developed for large-area deposition of organic thin films, such as those needed for demonstrating lasing action. In this work, we combine the large area processability of organic thin films and a unique method for fabricating MEMS structures to demonstrate arrays of VCSEL. These devices have an effective cavity length that is as small as 3 wavelengths ($3\lambda$) and a lasing wavelength that is mechanically tunable over $\Delta \lambda=10$ nm with 6V of electrostatic membrane actuation.

Many earlier studies demonstrated lasing emission from organic thin films with a broad gain spectrum, which enabled broad tunability of the lasing emission line. However, the lasing emission spectrum of a typical tunable organic solid state laser, reported to date, is fixed by the fabrication process parameters and cannot be dynamically varied post fabrication. In a few works that demonstrated dynamically tunable organic lasers, spectral tuning was implemented by using external mirror stages or with manually switchable gain media modules.

More compact, integrated organic lasing systems employing electroactive polymers or liquid crystals to electrically tune the emission wavelength have also been demonstrated, but often required high actuation voltages (0.1-3.5 kV). In contrast, inorganic state-of-the art lithographically fabricated air-gap MEMS VCSELs with epitaxially grown III-V gain medium have been shown with tunable spectral emission at much lower actuation voltages. However, these VCSELs lase in the infrared part of the spectrum and are limited in scalability due to the size of the single-crystal wafers on which lasers are fabricated.

Nevertheless, the key advantage of the lower operating voltage of these VCSELs is enabled by the lithographic fabrication processes that define the small physical dimensions of these structures, which can lead to large electric fields (and hence sufficient electromechanical force) even at small applied voltages. Thus, in this work we considered similar high-resolution schemes for fabricating organic VCSELs, but with the challenge of avoiding the organic film exposure to solvents and elevated temperatures, both of which can deleteriously affect the organic gain materials.

In certain embodiments of the disclosure, an integrated organic air-gap MEMS is fabricated by using an additive solvent-free membrane transfer technique disclosed above. The technique can be applied to fabrication of scalable, large area, device arrays. Unlike the conventional tunable VCSEL, the disclosed suspended membrane-cavity structure can be actuated electrically as well as mechanically. Such actuation makes the device suitable for use as a contactless-readout pressure sensor.

Figure 8A:
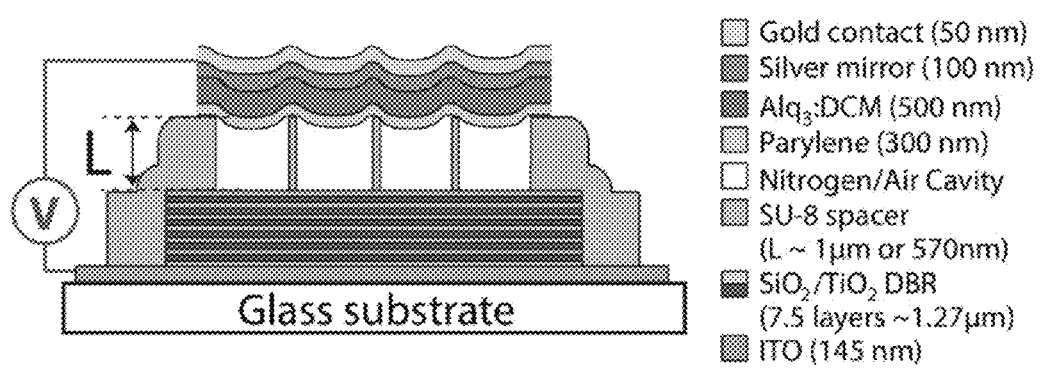
FIG. 8A schematically shows a cross section of a tunable laser device structure according to one embodiment of the disclosure.

FIG. 8A shows a schematic cross-section of a completed array of devices. The lasing resonator of the VCSEL structure is formed by the vertical cavity between a bottom planar distributed Bragg reflector (DBR) and a movable silver mirror layer, which is part of the composite top membrane. A 500 nm-thick layer of tris-(8-hydroxyquinoline)aluminum ($Alq_3$) doped with 4-(dicyanomethylene)-2-methyl-6-(4-dimethylaminostyryl)-4H-pyran (DCM) was employed as the organic gain medium inside the resonator. Upon photoexcitation, excitons are generated inside the $Alq_3$ host and undergo the Forster resonant energy transfer (FRET) to the DCM dopant molecules where they recombine to produce luminescence. The DCM molecules have a broad visible photoluminescence (gain) spectrum ranging 100 nm in wavelength ($\lambda$), thus enabling a broad tunable range of the resulting VCSEL structure.

The device of FIG. 8A was fabricated on a glass substrate coated with a 150 nm-thick indium tin oxide (ITO) layer that served as a bottom electrode. Alternating layers of $SiO_2$ and titanium dioxide ($TiO_2$) were sputter-deposited on top of ITO to form a distributed Bragg reflector (DBR) mirror with a 100 nm stop-band centered at $\lambda=620$ nm, matching the peak photoluminescence (PL) emission of the organic gain medium. An SU-8 photoresist spacer layer, which in one set of devices was about 1 micrometer thick and in the second set of devices was about 570 nm thick, was then deposited and circular cavities 100 μm in diameter were patterned thereon. In another embodiment the disclosed techniques were applied to fabricate cavities in the range of 25-100 microns and composite membrane covering the cavities.

The top membrane of FIG. 8A was fabricated separately on a glass carrier substrate, starting with a 300 nm-thick structural support layer of parylene-C, which was chemically vapor-deposited on the glass. On top of this parylene-C polymer membrane, a thermally evaporated stack of 500 nm-thick layer of $Alq_3$:DCM (2.5% DCM doping) gain medium, about 100 nm-thick silver mirror, and about 50 nm-thick gold contact electrode were deposited in sequence. The completed membrane was attached to a flexible handle frame and mechanically delaminated from the glass. Supported only at the perimeter by the handle frame, the released composite membrane was then transferred in nitrogen atmosphere on top of the patterned SU-8 cavities to form suspended membrane cavities. Finally, the handle frame was removed, completing device fabrication.

Figure 8B:
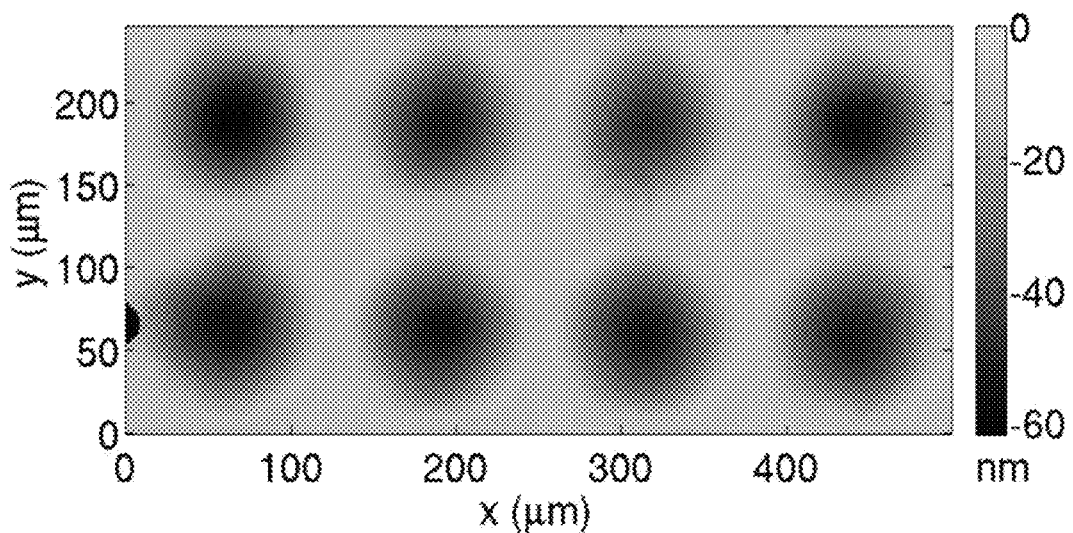
FIG. 8B is an optical interferometry difference image of membrane-covered cavities under applied bias according to an embodiment of the disclosure.

Membrane deflection under electrostatic actuation was confirmed via optical interferometry (Wyko NT9100®, by Bruker Nano Inc.) The contour image in FIG. 8B shows the deflection of the suspended membrane into the underlying L=1 μm deep cavities when a 20 V bias was applied between the top gold contact and the bottom ITO electrode. Increasing the applied voltage increased the electrostatic force between the membrane and the bottom electrode, hence, increasing the membrane deflection.

FIG. 9A plots the membrane deflection profiles for a range of applied biases from 0 to 20V for a single cavity, showing a maximum center deflection of nearly $\Delta L=60$ nm at 20 V. The increasing membrane deflection at higher voltages results in a decreasing optical cavity length, causing a blue-shift in cavity emission.

Optical measurements were performed using a microscope setup to focus a $\lambda=400$ nm pulsed excitation laser (1 kHz repetition rate, 100 fs pulse duration) through the planar DBR into the cavity. The excitation wavelength is outside the DBR stopband, allowing for efficient excitation of the organic film. The same objective captures subsequent cavity mode emission, and the emission is focused into a grating spectrograph (Princeton Instruments Acton 5P2300®) with a charge-coupled device array detector (Princeton Instruments Pixis®) for spectral analysis. In order to correlate cavity emission shift and membrane deflection, cavity emission spectra were collected with the same devices biased at the same actuation voltages as those used in the membrane deflection measurements. The optically pumped devices were tested in a nitrogen-rich environment at atmospheric pressure to minimize photo-oxidation damage to the organic gain medium.

A typical cavity mode luminescence emission spectrum of these MEMS VCSEL devices under a range of applied biases is plotted in FIG. 9B. As the applied bias increases from 0V to 20 V, the cavity mode peak wavelengths shift by over 10 nm and reversibly return to their initial values when the voltage bias is removed. Since membrane curvature, and hence cavity length variation, increases with applied voltage, the cavity resonator experiences higher loss as evidenced by a slight decrease in peak intensity and increase in cavity mode width with increasing applied bias. The 30 μm excitation spot was centered to avoid the cavity edges where the top mirror exhibits the largest curvature, which would cause additional mode broadening and intensity loss.

FIG. 9C compares the shift in peak emission of the $\lambda=592$ nm cavity mode (blue circles) and the corresponding change in membrane profile (red dots) for the same cavity, zeroed to the peak wavelength at 0 V. The error bars reflect a range of measured deflections due to membrane roughness and increased deflection curvature within the approximately 30 μm excitation spot size at each applied voltage bias; the relatively consistent error bar lengths suggest that cavity length variation within the excitation spot is dominated by membrane roughness rather than deflection curvature. Given the calculated optical cavity length ($4\lambda$), peak wavelength shifts ($\Delta\lambda$) are expected to follow the relationship $4\Delta\lambda=\Delta L$, where $\Delta L$ is the change in air-gap spacing due to membrane deflection; the scales of the y-axes in FIG. 9C reflect this relation. FIG. 9D shows the calculated average pressure across membrane due to applied bias compared to observed change in cavity emission peak wavelength. The average electrostatic pressure at each voltage is calculated using membrane deflections obtained via interferometry. Since both the membrane deflection and electrostatic pressure scale with the square of the applied voltage, the calculated pressure is proportional to the change in measured peak cavity emission, resulting in a device pressure sensitivity of 85 Pa/nm.

Figure 10A:
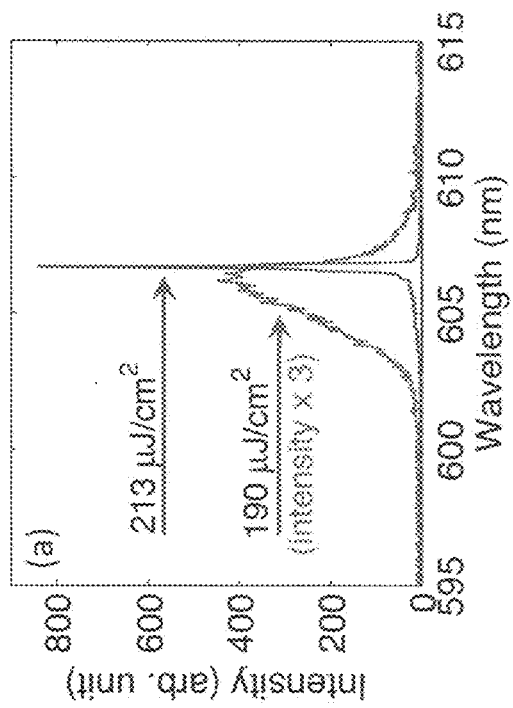
FIG. 10A shows device emission spectra for select pump energy densities to illustrate spectral output just below and just above the lasing threshold power for the exemplary device of FIG. 8A.
Figure 10B:
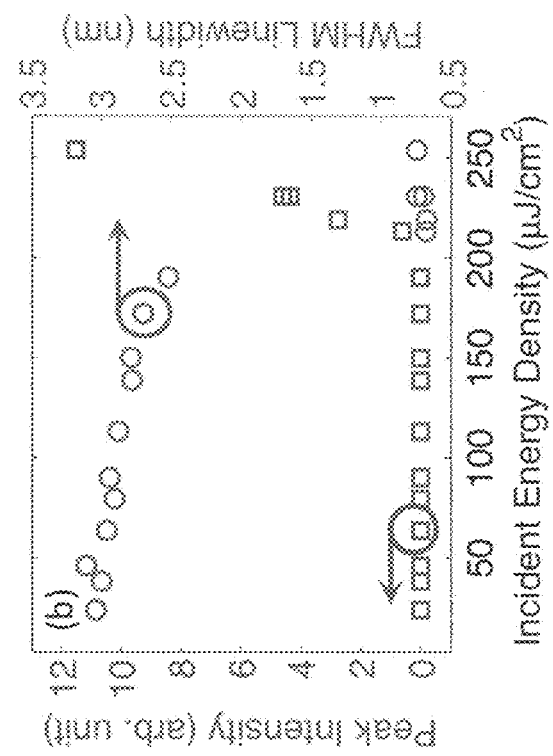
FIG. 10B shows peak intensity of spectral mode (left axis) and mode width (right axis) as a function of estimated excitation energy density illustrate transition between cavity mode and lasing mode at threshold.

The second set of devices with a thinner, 570 nm-thick, SU-8 spacer layer were fabricated to reduce the actuation voltages and lasing threshold. FIG. 10A plots the emission intensity of the $3\lambda$ device around the lasing threshold. Device lasing operation, demonstrated in FIG. 10B, shows a typical input-power-dependent emission intensity and spectral mode linewidth, computed using the full-width half-maximum. At pump powers over the lasing threshold of 200 µJ/cm² incident power, the observed cavity modes reduce to a single lasing mode with significantly increased peak intensity. Concurrently, the emission linewidth of the cavity mode reduces to that of the monochromic lasing mode.

Figures 11A, 11B:
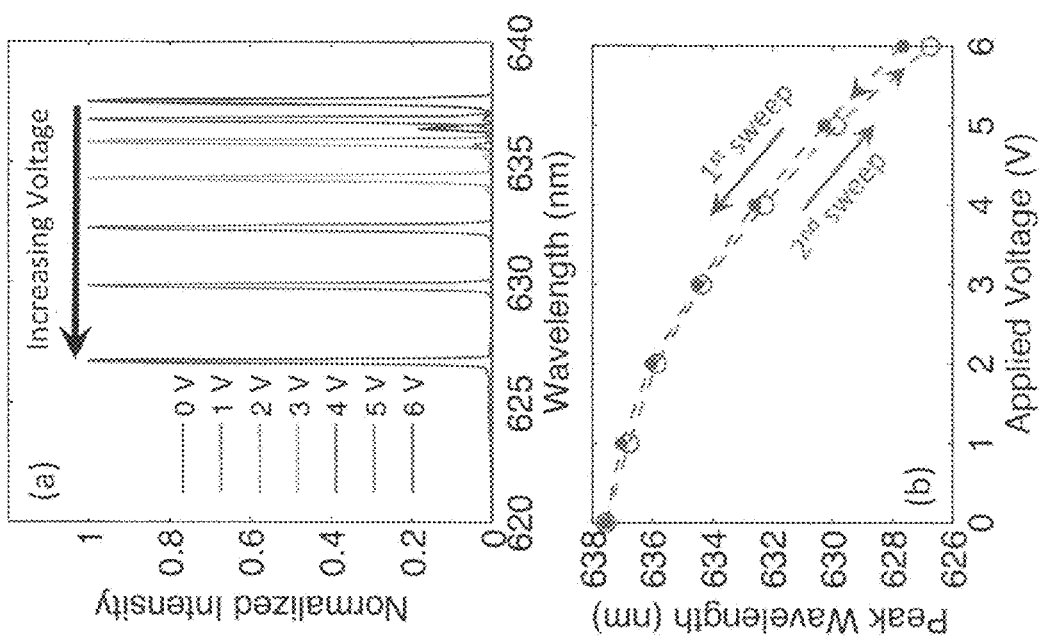
FIG. 11A shows tuning laser emission wavelength using electrostatic pressure demonstrating reversible tunable range from $\lambda=637$ nm to about $\lambda=628$ nm in response to 6 V actuation for the exemplary device of FIG. 8A.
FIG. 11B shows peak wavelength of lasing mode as a function of applied bias, demonstrating less than 1 nm hysteresis between forward and reverse sweeps.

As previously observed for cavity modes in FIG. 9, the lasing mode blue-shifts with electrostatic actuation of the composite membrane. For the shorter cavities, a $\Delta\lambda=10$ nm laser mode shift occurs at a lower applied voltage of 6 V, as shown in FIG. 11A. The reversibility of the laser spectral shifts is highlighted in FIG. 11B. The laser emission hysteresis error is below 1 nm.

By varying the device geometry (e.g., spacer layer thickness, cavity diameter and membrane thickness), the composite membrane-cavity structure demonstrated in this work can be optimized to enable spectral tuning over a wider range at low voltages, thus utilizing the full emission spectral range of the organic gain medium. One caveat is that the tunable range is limited by the need to avoid membrane pull-in and permanent stiction of the membrane to the cavity bottom. Membrane pull-in may occur in tunable electrostatic gaps when the attractive electrostatic force dominates the restoring elastic/spring force at larger deflections. Additionally, the oxygen-sensitivity of the Alq3:DCM lasing medium and resulting photo-bleaching degradation limits device stability in non-inert environments, necessitating device encapsulation for stable, long-term device operation. Photo-oxidation of the organic gain medium can be observed in both spectral shift and intensity decrease over long periods of operation, resulting in loss of lasing modes. Although the laser can be swept across a 10 nm range over repeated optical excitation tests, the observed gradual blue-shift of the tuning range by a few nanometers points to the need for device encapsulation or, alternatively, replacement of the $Alq_3$:DCM system with a more air-stable, flexible gain medium.

The demonstrated device structure may be directed beyond the tunable laser applications. Instead of electrostatically actuating the device membrane to tune the lasing frequency, the membrane can also be mechanically/pneumatically actuated to implement an optical, contactless readout pressure sensor, where shifts in the cavity emission wavelength (above or below lasing threshold) may be calibrated to indicate changes in pressure above the membrane. Assuming the same membrane deflection under equal mechanical pressures for both demonstrated device arrays, the estimated pressure sensitivity of the 4λ cavity in FIG. 9D suggests a sensitivity of 64 Pa/nm for the thinner 3λ lasing device. The sensor response rate could potentially approach 2 MHz, as determined using a lumped-parameter force-deflection model and assuming no viscous-damping losses in the deflecting membrane. The pressure sensor sampling rate could also be limited by the lasing sampling rate above threshold; due to triplet loss mechanism in the organic gain medium, organic lasers often operate with repetition rates in the range of kHz. However, this gain limitation may be circumvented by operating in cavity emission mode or by replacing the Alq3:DCM with materials supporting continuous wave (CW) or quasi-CW lasing operation.

Thus, an electrostatically tunable organic MEMS VCSEL, was enabled by a solvent-free additive membrane transfer fabrication technique according to the disclosed embodiments. Electrical actuation and optical characterization of a typical device show spectral tuning of about $\Delta\lambda$ 10 nm at 6 V. Because the flexible composite membrane can be actuated either electrically or mechanically, these organic MEMS VCSEL structures can be applied to both tunable lasing in the visible or near-infrared range as well as all-optical, contactless, large area pressure-sensing applications.

Fabrication and Other Applications of Transfer-Printed Composite Membranes—

The substitution of organic emissive materials for the inorganic emissive materials in tunable air-gap MEMS structures is complicated. Frequently, the organic semiconductors are incompatible with conventional MEMS and CMOS processes that involve exposure to wet chemistries, solvents, plasma or elevated process temperatures. In one embodiment of the disclosure, fabrication of integrated tunable organic optical microcavities is enabled by a solvent-free, additive membrane transfer process. By electrostatically actuating the composite membrane, we observe the cavity resonances shift by greater than 20 nm for estimated electrostatic pressures up to 2.5 kPa. Compared to conventional all-optical photonic crystal based pressure sensors, the disclosed optically-pumped device potentially allows single-point contactless-readout for large area pressure sensor arrays. Additionally, the device structure and transfer technique are easily applicable to large area fabrication of electrostatically tuned organic lasers.

Figure 12:
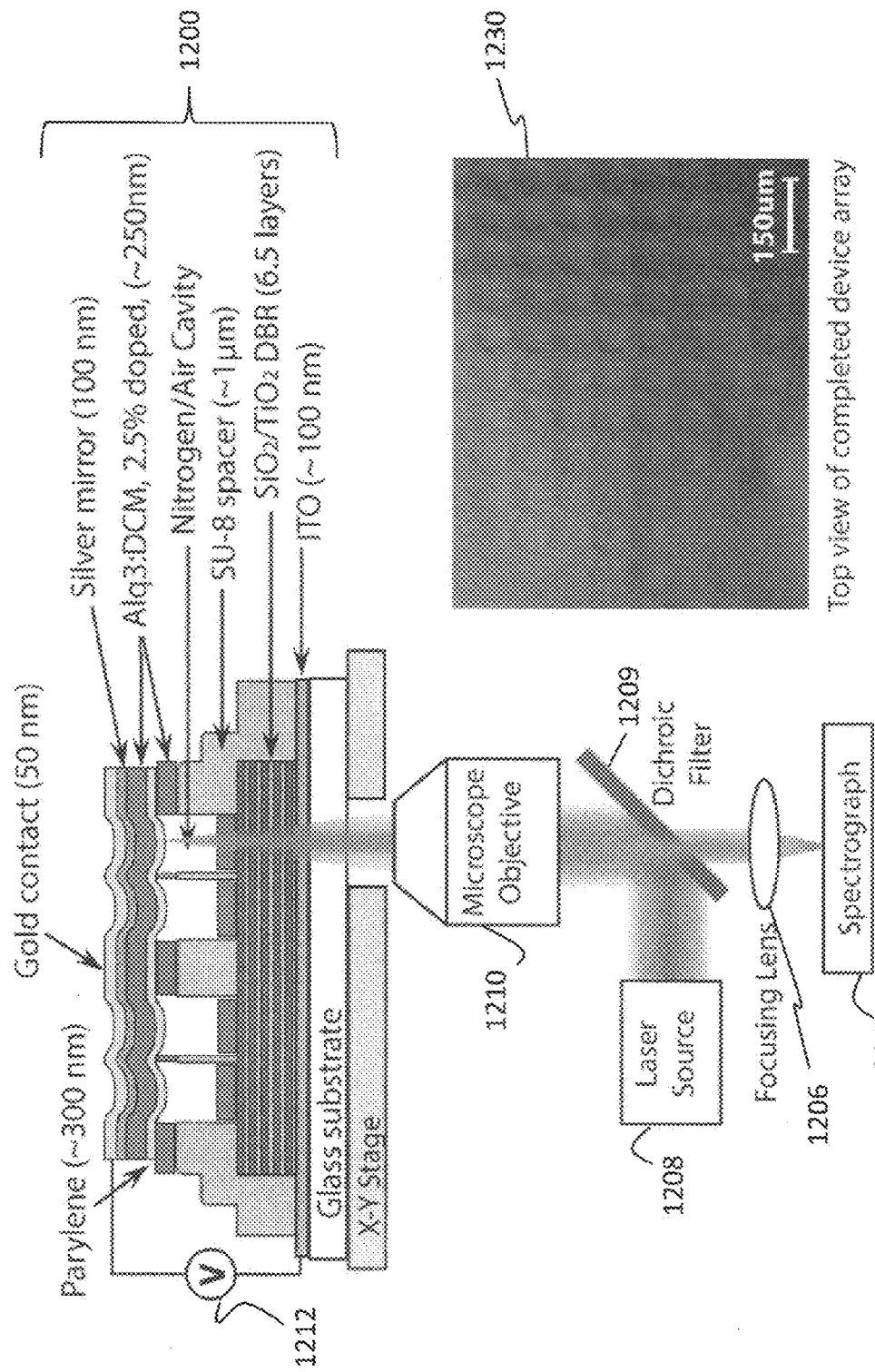
FIG. 12 is a schematic cross-section of the device structure and test setup according to one embodiment of the disclosure.

FIG. 12 is a schematic cross-section of the device structure and test setup according to one embodiment of the disclosure. The membrane-microcavity structure of FIG. 12 is formed by the additive transfer of a 700 nm-thick composite membrane 1200 onto a pre-patterned substrate as discussed above. In contrast to the conventional additive transfer printing of suspended gold membranes, the transfer method reported here avoids the use of solvents, which can damage the organic active layer $Alq_3$ doped with DCM. FIG. 12 also shows microscope objective 1210 for focusing laser excitation from laser source 1208 through dichroic filter 1209. Focusing lens 1206 directs the returning emission to spectrograph 1204. FIG. 12 also shows a top view of the fabricated device array 1230.

Figure 13:
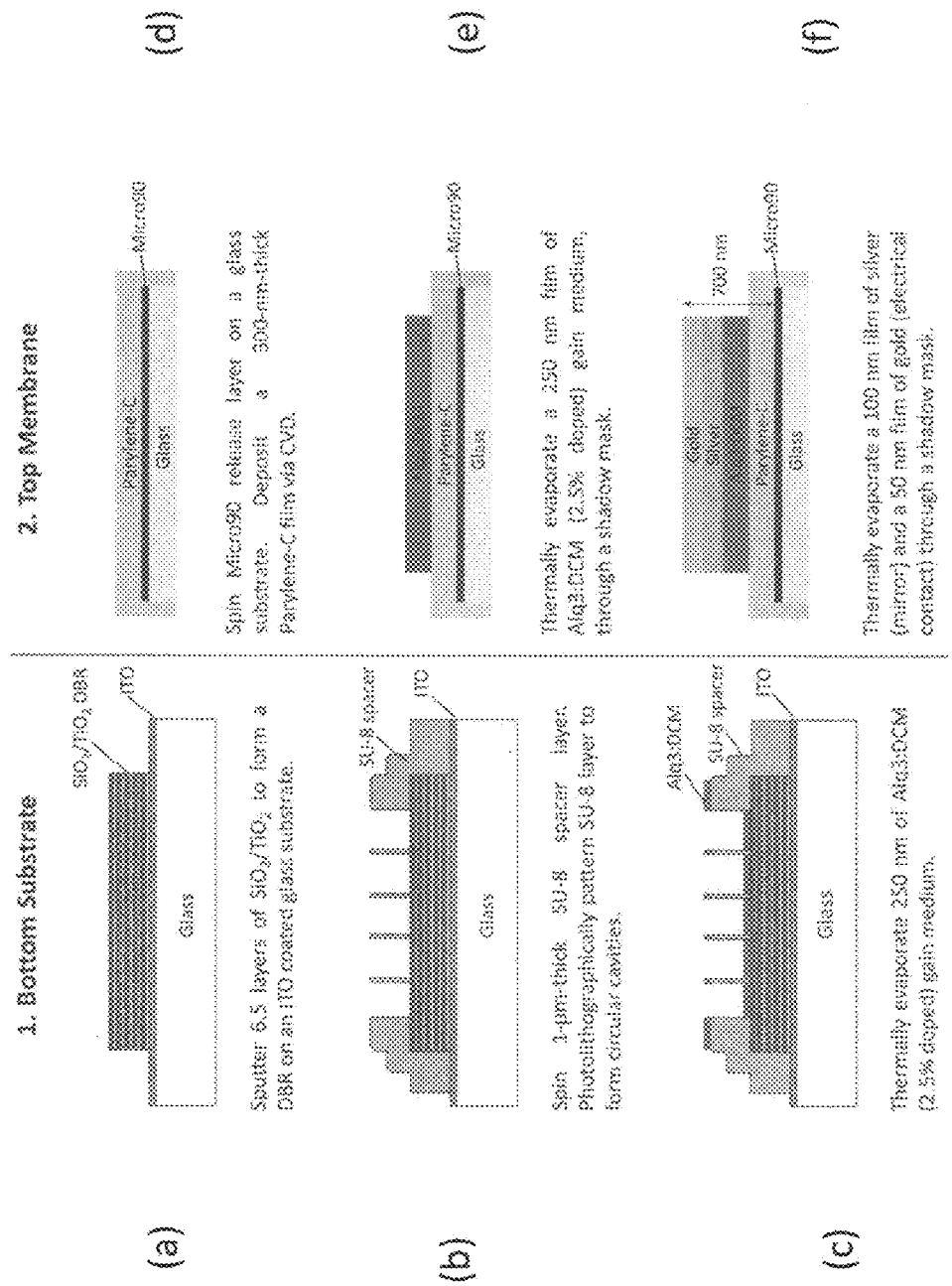
FIG. 13 schematically illustrates the fabrication process for the membrane-microcavity structure of the device of FIG. 12.

FIG. 13 schematically illustrates the fabrication process for the membrane-microcavity structure of the device of FIG. 12. The processing steps of FIG. 13 are shown in steps (a) through (e). At step (a), the bottom substrate consisting of a 12.7 mm×12.7 mm glass substrate is coated with ITO, which serves as a transparent bottom electrode. Alternating layers of $SiO_2$ and $TiO_2$ were sputtered to form a DBR mirror with a 100 nm stop-band centered at about 620 nm, which matches the peak photoluminescence (PL) emission of the organic layer. The DBR passes an excitation wavelength of 400 nm with less than 10% reflectivity, but reflects over 98% of the emission wavelength of 620 nm. The final 1 µm-thick layer of $TiO_2$ acts as an optical cavity spacer on top of the DBR. Circular cavities of about 50 µm in diameter and approximately 1 µm deep were then patterned in a SU-8 layer atop the DBR stack as schematically illustrated at step (b).

The composite membrane is fabricated separately, starting with the chemical vapor deposition of a 300 nm thick layer of a transparent polymer, parylene, onto a glass carrier substrate. This is shown at Step (d) of FIG. 13. A 250 nm-thick layer of $Alq_3$ doped at 2.5% with DCM is thermally co-evaporated through a shadow mask onto both the membrane and the cavity-patterned substrate as shown at step (e). Step (e) is optional and may be applied depending on the desired device functionality and specification. Next, a 100 nm-thick silver mirror and a 50 nm-thick gold contact are deposited in sequence onto the membrane as shown in step (f). The completed 700 nm thick composite membrane was attached to a flexible cutout handle frame and released from the carrier by peeling.

Figure 14A:
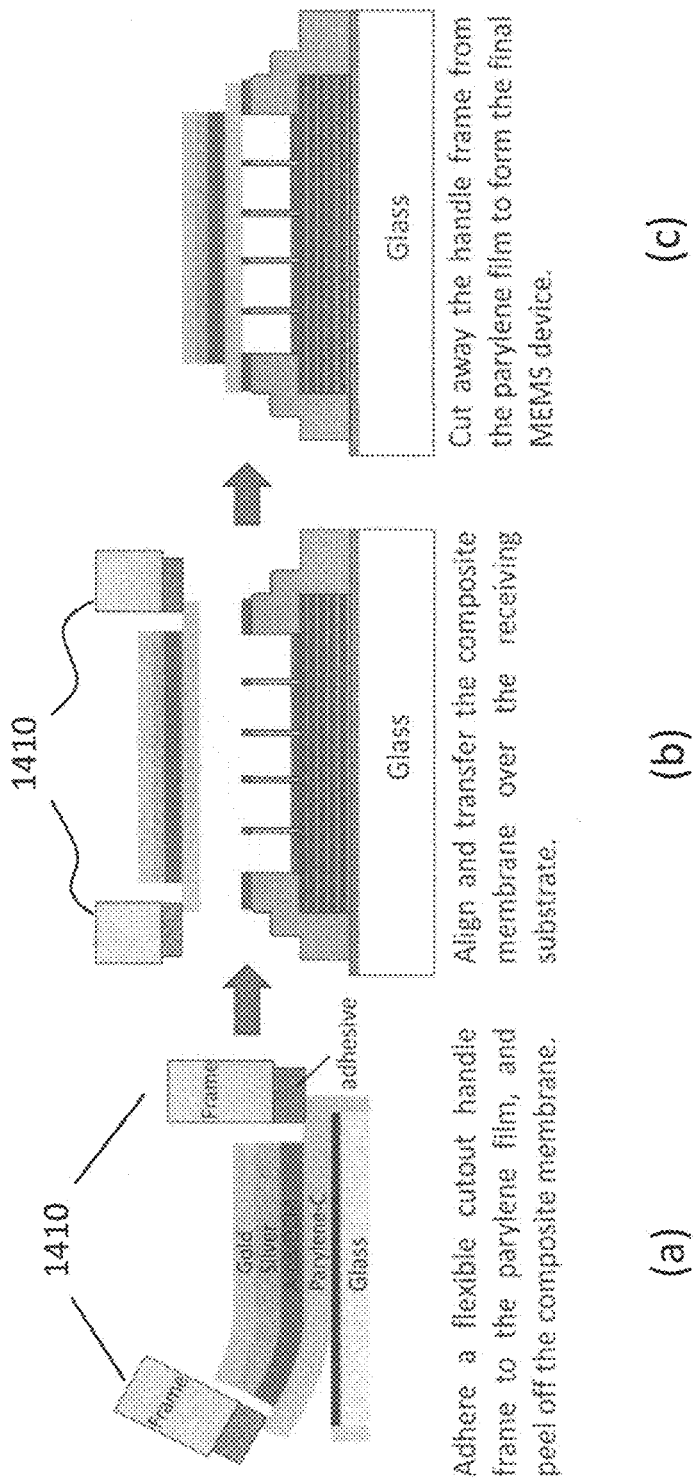
FIG. 14A shown the contact transfer of membrane to the bottom substrate of FIG. 13.

FIG. 14A shows the contact transfer of membrane to the bottom substrate of FIG. 13. As illustrated in FIG. 14A, the membrane is transferred to the cavity-patterned substrate and it adheres lightly to the substrate due to the bottom parylene layer. The frame (interchangeably, handle) 1410 is then removed. The use of ultra-thin parylene enables solvent-free transfer of a large area (8 mm×8 mm) composite membrane that encloses an array of microcavities when viewed from the top as shown in FIG. 12.

The composite membrane deflections under electrostatic actuation were characterized using an optical interferometer (Wyko NT9100, Bruker Nano Inc.®). Specifically, voltage biases from about 0 V to about 50 V were applied between the top gold membrane contact and the bottom ITO electrodes. The electrostatic force of attraction between the flexible top membrane and the rigid bottom electrode causes the suspended composite membrane to deflect into the circular cavities. The results are shown in FIG. 14B as membrane deflection profile for a plurality of cavities as a function of applied voltage.

Figure 14B:
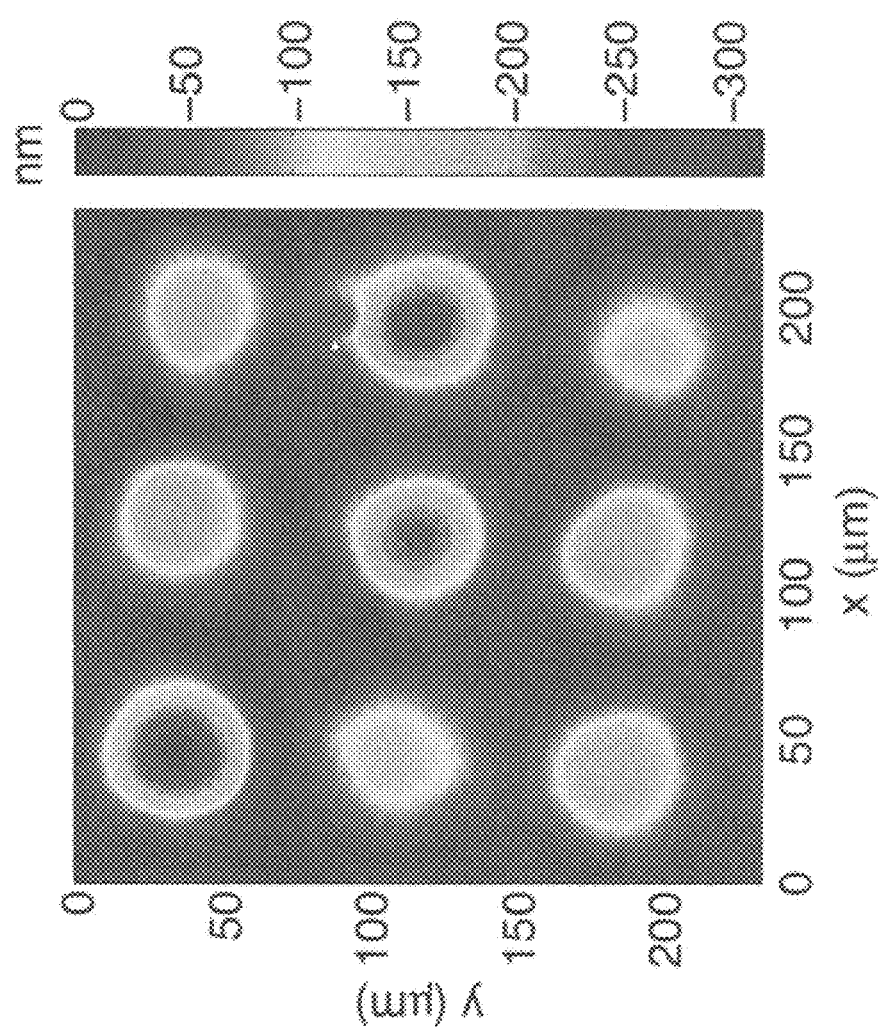
FIG. 14B shows actual deflections from membrane covered cavities that were formed using the fabrication process of FIG. 14A.

Specifically, FIG. 14B shows net membrane deflection over multiple circular cavities. Optical interferometric measurement at 0 V was subtracted from that at 50 V to generate the net deflection contour image. The non-uniform deflection profiles over identical 50 µm-diameter cavities reflect non-uniform tension across the membrane which may be due to the transfer process.

Figure 15:
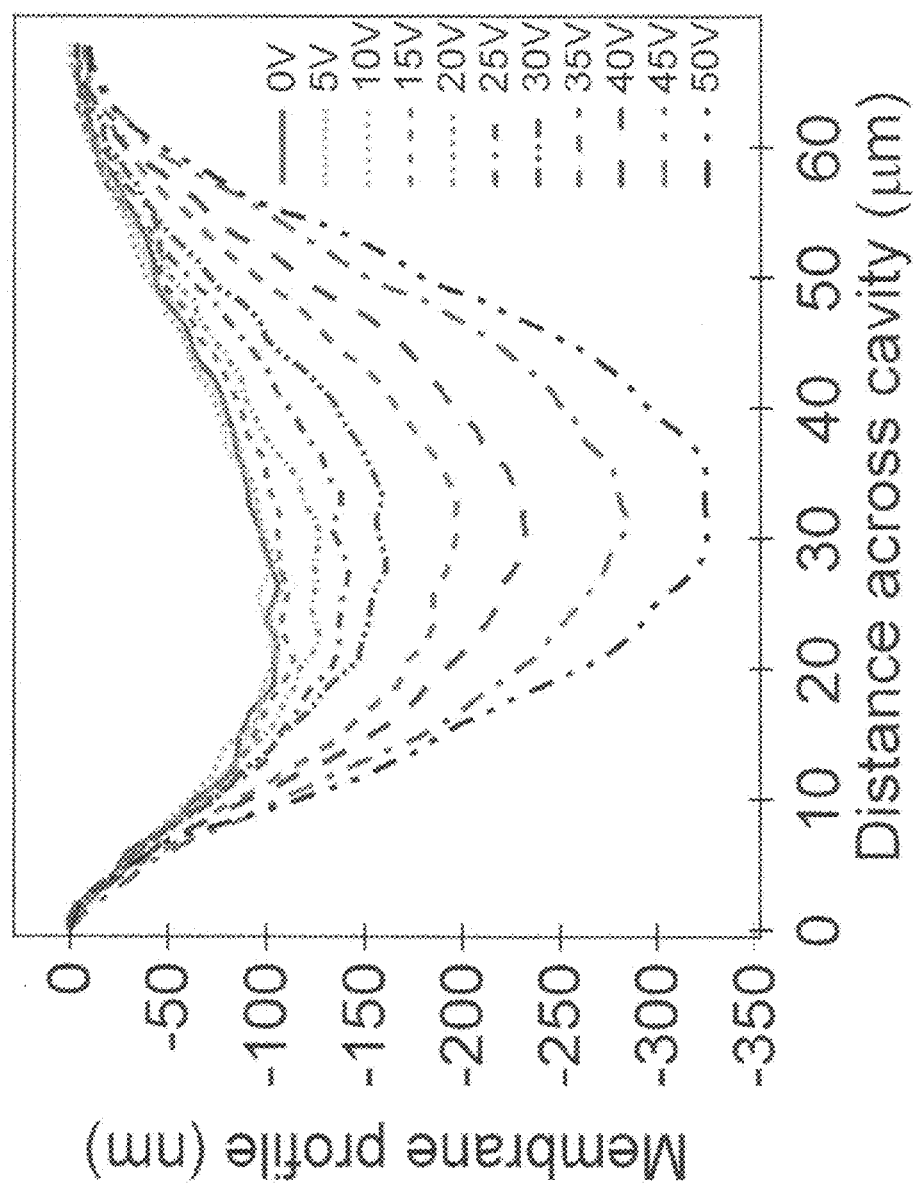
FIG. 15 shows membrane deflection profile for a single cavity as a function of applied voltage.

FIG. 15 shows membrane deflection profile for a single cavity as a function of applied voltage. The single cavity may define any cavity formed according to the disclosed techniques. For the single cavity depicted in FIG. 15, the 700 nm-thick membrane has a maximum deflection of about 106 nm when no voltage is applied and it increases to about 325 nm at 50 V actuation. The deflection at 0 V is due to the transferred membrane sagging into the cavity because of insufficient tension in the membrane. Membrane tension is not uniform across the membrane, resulting in varying maximum deflections across the multiple shown cavities as seen in FIG. 14B. At about 50 V applied bias, maximum deflections across these cavities range from about 140 nm to about 290 nm. The non-uniformity may arise due to the membrane transfer process rather than the patterning of the bottom substrate.

The composite membrane undergoes reversible deflections over the range of applied voltages shown in FIG. 15. Since the maximum deflection, $w_0$, is on the order of the thickness, h, of the membrane, the theory of bending of plates that is valid for deflections much smaller than the thickness of the plates is inapplicable. It is thus shown that deflection can be on the order of the thickness of the membrane itself. Hence, membrane deflections may be modeled using the energy method. It may be assumed that the deflection profile, w(r), of the membrane, obtained by applying spatially-uniform pressure, q, may be modeled according to Equation 1 as follows:

$$w(r) = w_0\left(1 - \frac{r^2}{a^2}\right)^2 \quad (1)$$

where r is the radial distance from the center of the cavity of radius a, and w is the deflection of the membrane at r. Since the deflection of the membrane is non-zero when no voltage is applied, we fit the above equation to the difference in the membrane deflection at any applied voltage and at 0 V.

Figure 16:
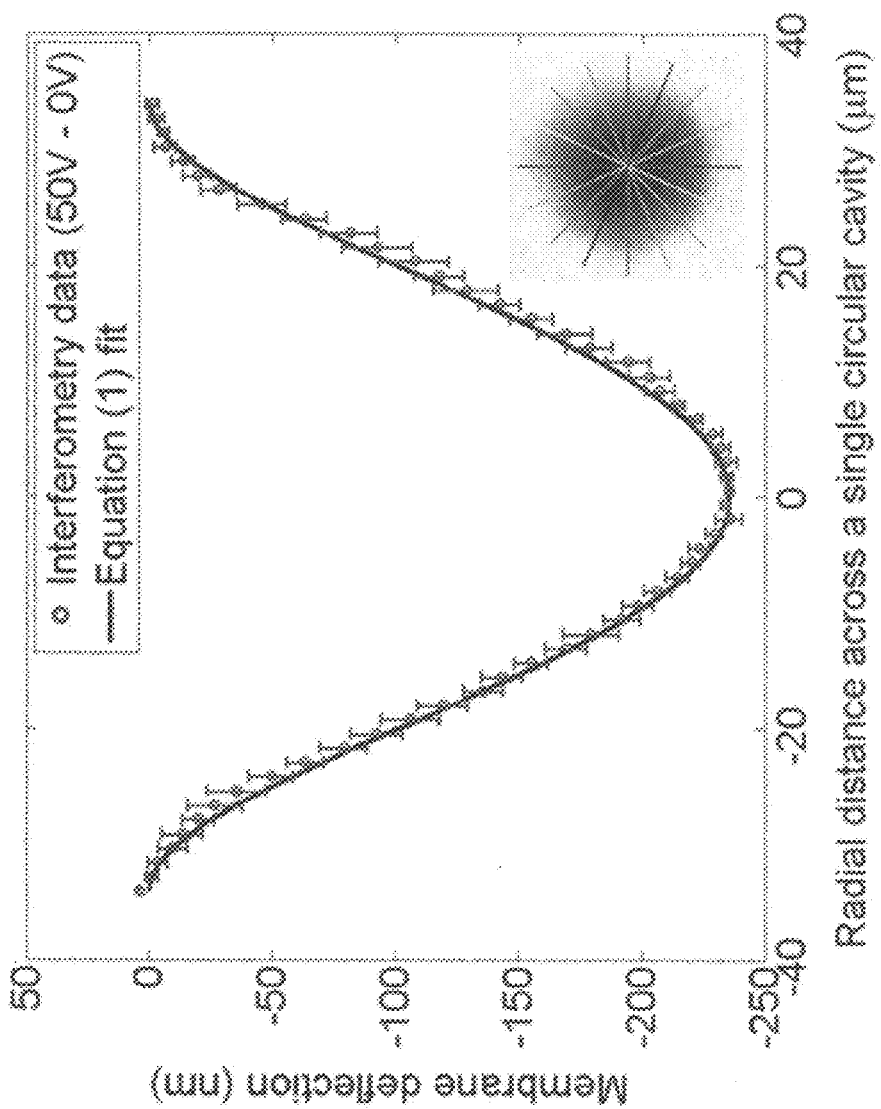
FIG. 16 shows net membrane deflection for a MEMS device formed according to one embodiment of the disclosure.

FIG. 16 shows net membrane deflection for a MEMS device formed according to one embodiment of the disclosure. Specifically, FIG. 16 shows the fit of the deflection profile from Equation (1) to the measured net deflection profile at about 50 V. This close fit implies that the radially varying electrostatic pressure, q(r), acting on the membrane at any non-zero applied voltage can be approximated as an effective uniform pressure, qeff, using Equation (2) as follows:

$$2\pi \int_0^a q(r)\delta w_0\left(1 - \frac{r^2}{a^2}\right)^2 rdr = 2\pi q_{\textit{eff}} \int_0^a \delta w_0\left(1 - \frac{r^2}{a^2}\right)^2 rdr. \quad (2)$$

The effective pressure is then used to calculate the effective Young's modulus, E, of the composite membrane. At about 50 V actuation, $q_{\textit{eff}}$ is 2.5 kPa for the cavity shown in FIG. 15. Assuming a Poisson's ratio of 0.4 for the 700 nm-thick composite membrane, the effective E is 4 GPa. The estimated Young's modulus can be comparable to that of other organic films, suggesting that the mechanical deflection characteristics of the composite membrane in the large deflection regime are primarily due to its organic film constituents.

Optical measurements were performed using a 400 nm excitation laser at 1 kHz repetition rate with averaged pulse energy of 0.2 nJ. As illustrated in FIG. 12, microscope objective 1210 focused a collimated laser beam through the planar DBR into the cavity. The same objective 1210 captured subsequent cavity mode emission. A 405 nm long pass filter 1209 diverted any residual laser light from laser source 1208, and the emission is focused by lens 1206 into a grating spectrograph 1204 for spectral analysis. The laser excited the optically active organic $Alq_3$:DCM layer, which had a broad emission spectrum. The organic photoluminescence was enhanced by the vertical resonator cavity created by the planar DBR and the silver mirror layer within the composite membrane 1200.

Figure 17:
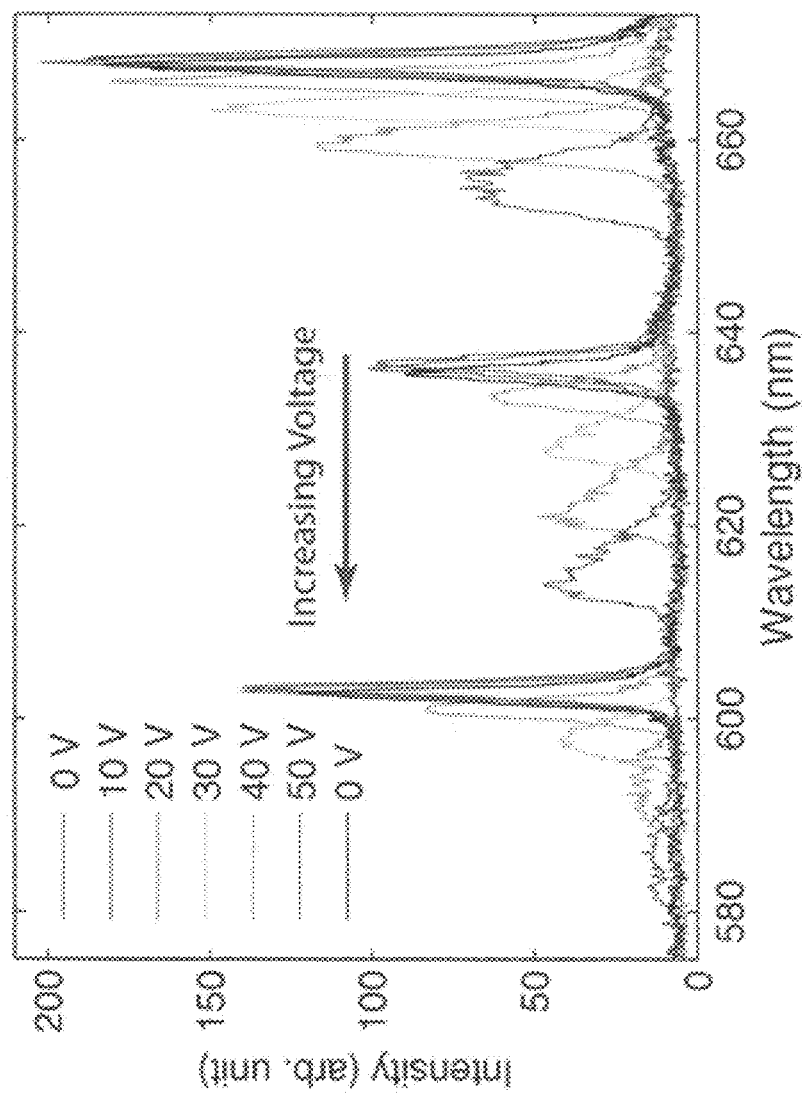
FIG. 17 shows an exemplary longitudinal mode emission spectra for a range of applied voltages for the exemplary device according to one embodiment of the disclosure.

FIG. 17 shows an exemplary longitudinal mode emission spectra for a range of applied voltages for the exemplary device according to one embodiment of the disclosure. Specifically, FIG. 17 shows typical measured spectra of the longitudinal cavity mode of the structure illustrated in FIG. 12. The cavity length was tuned to provide the observed change in device emission wavelengths by electrostatically actuating the composite membrane. The emission of the device shows reversible tuning over 20 nm. Each longitudinal mode emission was fitted to a Gaussian function to find mode peak and width.

Figure 18:
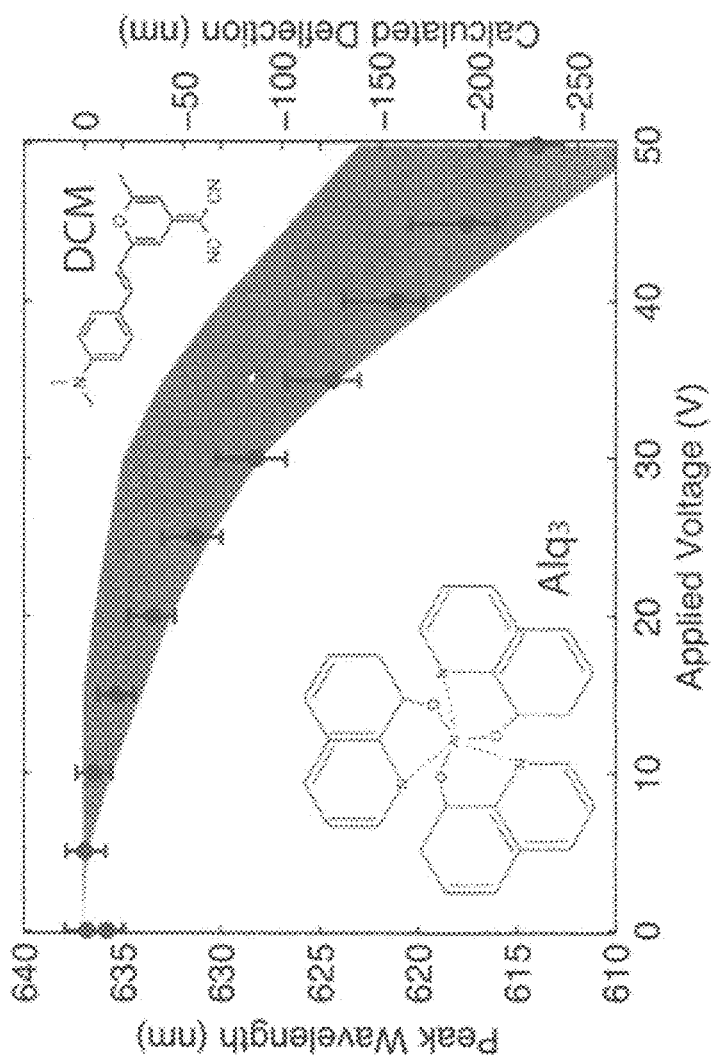
FIG. 18 shows a fitted peak wavelength and corresponding calculated membrane deflection as a function of applied voltage.

FIG. 18 plots the fitted peak of the measured 637 nm cavity mode, the central peak shown in FIG. 17. FIG. 17 shows a reversible blue shift of mode emission up to 23 nm or a 3.6% change in peak wavelength. The device fabricated according to the disclosed embodiments had a total optical path length of approximately 6.34 µm as calculated using the measured free spectral range, which is defined by the separation between the spectral mode peaks. This corresponds to approximately 20 longitudinal modes or 10 wavelengths within the vertical cavity resonator. Thus, the total physical deflection of the composite membrane scales by a factor of 10, resulting in an estimated membrane deflection of 230 nm at 50 V. The calculated membrane deflection from the optical data is indicated on the right vertical axis of FIG. 18. FIG. 18 also plots, in shaded grey, the maximum and minimum deflection from the interferometry data for the corresponding voltages. The optical resonance shift is in good agreement with the interferometry measurements.

Since the electrostatic force on the membrane is proportional to the square of the applied voltage, a quadratic relationship between the membrane deflection and the applied voltage is observed. Consequently, peak emission shift is proportional to the square of the applied voltage. This relationship does not hold at high voltages as the membranes have been observed to collapse into the patterned cavities due to pull-in, and stiction prevents further electrostatic modulation of membrane deflection.

FIGS. 12-18 demonstrate the use of a solvent-free additive membrane transfer technique in an electrostatically tunable organic device. Electrical actuation and optical characterization of a completed device show spectral tuning greater than 20 nm for membrane deflections of over 200 nm at about 50 V. Shorter optical cavities with fewer modes, fabricated using the disclosed embodiments, may yield higher tunable range at a lower applied voltage. With high tunable range and mechanical pressure sensitivity, the demonstrated device structure may be applied to pressure sensing and tunable organic lasing device applications. The composite membrane elements can be varied in both geometry and composition to optimize device performance and to explore other physical phenomenon.

While the principles of the disclosure have been illustrated in relation to the exemplary embodiments shown herein, the principles of the disclosure are not limited thereto and include any modification, variation or permutation thereof. Further, the ranges provided herein are exemplary and demonstrative. The provided ranges include any subset of other values within the range and other specific range or number within the disclosed broader range.

What is claimed is:

1. A spectrally tunable light emitting device, comprising:
a substrate;
a bottom electrode layer covering a portion of the substrate
a planar reflective layer covering a portion of the bottom electrode layer;
a spacer layer defining a plurality of cavities separated by a plurality of ridges; and
a composite membrane having a parylene layer and a plurality of secondary layers to cover the plurality of cavities, the composite membrane further including an optically active layer.

2. The tunable device of claim 1, wherein the optically active layer is an emissive organic layer, a quantum dot layer, a polymer layer or a combination thereof.

3. The tunable device of claim 2, wherein the planar reflective layer is a distributed Bragg reflector (DBR) layer.

4. The tunable device of claim 3, wherein the DBR layer is formed from alternating layers of optically transparent index contrasting materials including $SiO_2$ and $TiO_2$.

5. The tunable device of claim 1, wherein the optically active layer further comprises $Alq_3$ doped with DCM and has a thickness of about 200 nm to about 1 micron.

6. The tunable device of claim 1, wherein the parylene layer has a thickness in the range of about 100 nm-2 microns; 100 nm-1 micron, 200-300 nm, 300-500 nm, 500 nm to 1 micron and 1-30 microns.

7. The tunable device of claim 1, wherein the plurality of adjacent ridges are configured to form an acute angle with the composite membrane.

8. The tunable device of claim 1, further comprising a power source for applying a bias between the bottom electrode layer and a top electrode of the composite membrane to thereby actuate the composite membrane.

9. The tunable device of claim 1, wherein the tunable device is configured to provide a membrane deflection of about 60 nm responsive to a bias of about 20V.

10. The tunable device of claim 1, wherein the optically active layer is excited to cause a cavity mode.

11. The tunable device of claim 10, wherein the cavity mode emission changes color in response to the external pressure on the membrane.

12. The tunable device of claim 10, wherein the optically active layer is excited by an external light source including a LED or a Laser.

13. The tunable device of claim 2, wherein the optically active layer is an optical gain medium.

14. The tunable device of claim 13, wherein an external light source is modulated to create a lasing action in the cavity.

15. The tunable device of claim 10, wherein cavity mode peak wavelengths reversibly shift when the voltage is cycled between 0 to 20V.

16. The tunable device of claim 14, wherein the lasing action in the cavity changes color in response to the external pressure on the membrane.

17. The tunable device of claim 1, wherein the device comprises a solvent-free cavity and a solvent-free composite membrane.

18. The tunable device of claim 1, wherein the composite membrane further comprises a reflective mirror.

19. The tunable device of claim 1, wherein the reflective mirror is conductive.

20. The tunable device of claim 1, wherein at least one of the plurality of cavities includes an optical gain medium at a distal end and wherein the composite membrane is formed over a proximal end.

21. The tunable device of claim 20, wherein the optical gain medium is an organic gain layer, a quantum dot layer, a polymer layer or a combination thereof.

22. The tunable device of claim 1, further comprising a detector to identify an optical spectral change due to a change in cavity geometry.

23. The tunable device of claim 1, wherein the plurality of cavities having a composite membrane define a tunable array.

24. The tunable device of claim 1, wherein the substrate defines a non-conductive substrate and supports a conductive layer interposed between the substrate and the spacer layer.

25. A optical micro-electromechanical structure (MEMS) transducer, comprising:
a substrate;
a planar reflective layer covering a portion of the substrate;
a spacer formed over the planar reflective layer, the spacer defining a plurality of cavities with each cavity having an optical gain medium at a distal end thereof;
a composite membrane having a parylene layer and a reflective layer, the composite membrane formed over a proximal end of each of the plurality of cavities;
an optical excitation source to excite the optical gain medium to provide cavity modes or lasing output inside the cavity which changes color in response to external pressure on the membrane.

26. The optical transducer of claim 25, wherein the composite membrane further comprises an optical gain medium layer.

27. A capacitive micro-electromechanical structure (MEMS) transducer, comprising:
a substrate;
a spacer layer formed on the substrate, the spacer layer defining a plurality of cavities separated by a plurality of ridges;

a composite membrane extended over the plurality of ridges and flexibly covering the plurality of cavities, the composite membrane having a parylene layer and an electrode layer; and a biasing source in communication with the electrode layer to provide a bias to the capacitive MEMS.

28. The capacitive MEMS transducer of claim 27, wherein the parylene layer has a thickness in the range of about 100 nm-2 microns; 100 nm-1 micron, 200-300 nm, 300-500 nm, 500 nm to 1 micron and 1-30 microns.

29. The capacitive MEMS transducer of claim 27, wherein the substrate is a conductive substrate in communication with the biasing source.

30. The capacitive MEMS transducer of claim 27, wherein the substrate further comprises one of a counter electrode, a patterned electrode or an active layer in communication with the biasing source.

31. The capacitive MEMS transducer of claim 27, wherein the biasing source applies a time-varying electrical signal to the capacitive MEMS to displace the composite membrane with respect to the substrate.

32. The capacitive MEMS transducer of claim 27, further comprising a detector coupled to the electrode to detect a change in capacitance due to an external stimuli causing a deflection in the composite membrane.

33. The capacitive MEMS transducer of claim 27, further comprising a plurality of drive electrodes positioned in each of the respective plurality of cavities, each drive electrode patterned to effect an asymmetrical deflection of the membrane in the respective cavity.

34. The capacitive MEMS transducer of claim 33, wherein the composite membrane further comprises a reflective layer and wherein the asymmetrical deflection of the membrane defines a tunable mirror.

35. The capacitive MEMS transducer of claim 27, wherein the composite membrane and at least one of the plurality of ridges form an acute angle.

36. The capacitive MEMS transducer of claim 27, further comprising a secondary parylene layer to encapsulate the MEMS transducer.

* * * * *